United States Patent
Sayama

(10) Patent No.: US 11,742,371 B2
(45) Date of Patent: Aug. 29, 2023

(54) IMAGING ELEMENT AND IMAGING APPARATUS

(71) Applicant: SONY SEMICONDUCTOR SOLUTIONS CORPORATION, Kanagawa (JP)

(72) Inventor: Yukihiro Sayama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 273 days.

(21) Appl. No.: 17/040,619

(22) PCT Filed: Mar. 29, 2019

(86) PCT No.: PCT/JP2019/014159
§ 371 (c)(1),
(2) Date: Sep. 23, 2020

(87) PCT Pub. No.: WO2019/189815
PCT Pub. Date: Oct. 3, 2019

(65) Prior Publication Data
US 2021/0118928 A1    Apr. 22, 2021

(30) Foreign Application Priority Data
Mar. 30, 2018    (JP) .................. 2018-068896

(51) Int. Cl.
*H01L 27/146*    (2006.01)
(52) U.S. Cl.
CPC .. *H01L 27/14621* (2013.01); *H01L 27/14627* (2013.01)

(58) Field of Classification Search
None
See application file for complete search history.

(56) References Cited

U.S. PATENT DOCUMENTS

| 9,917,134 B1* | 3/2018 | Hsieh ................... H01L 27/1462 |
| 2008/0067330 A1 | 3/2008 | Yamamoto |
| 2015/0200220 A1* | 7/2015 | Juenger ............. H01L 27/14685 438/70 |

(Continued)

FOREIGN PATENT DOCUMENTS

WO    WO 2017/134864    8/2017

OTHER PUBLICATIONS

International Search Report and Written Opinion prepared by the European Patent Office dated Jun. 20, 2019, for International Application No. PCT/JP2019/014159.

*Primary Examiner* — Ali Naraghi
(74) *Attorney, Agent, or Firm* — Sheridan Ross P.C.

(57) ABSTRACT

An imaging device and electronic apparatus incorporating an imaging device are provided. The imaging device includes a substrate and a plurality of photoelectric conversion units formed in the substrate. Each photoelectric conversion unit in the plurality of photoelectric conversion units is associated with at least one corresponding color filter in the plurality of color filters. The imaging device further includes a plurality of infrared light filters, wherein at least some of the photoelectric conversion units in the plurality of photoelectric conversion units are associated with at least one corresponding infrared light filter in the plurality of infrared light filters.

20 Claims, 24 Drawing Sheets

(56) References Cited

U.S. PATENT DOCUMENTS

| | | | | |
|---|---|---|---|---|
| 2015/0221691 A1* | 8/2015 | Watanabe | ............... | H04N 23/11 |
| | | | | 257/432 |
| 2015/0372036 A1* | 12/2015 | Suh | ..................... | H01L 27/1464 |
| | | | | 257/432 |
| 2017/0317132 A1* | 11/2017 | Hatakeyama | ........... | H01L 27/14 |
| 2019/0006406 A1* | 1/2019 | Ozawa | ................ | H01L 27/1462 |
| 2019/0166317 A1* | 5/2019 | Tanaka | ................. | H04N 25/131 |

* cited by examiner

[Fig. 1]
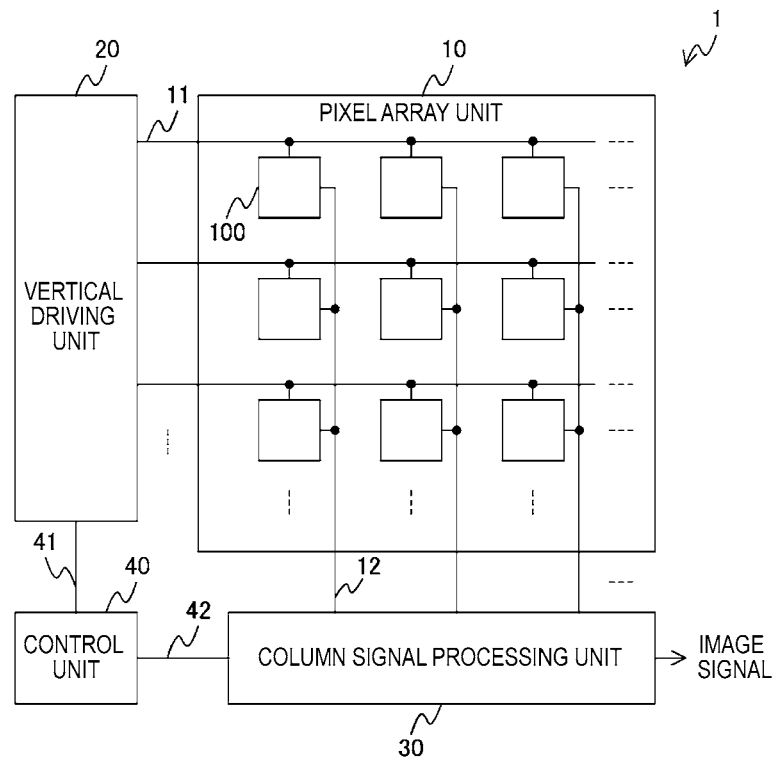
[Fig. 2]
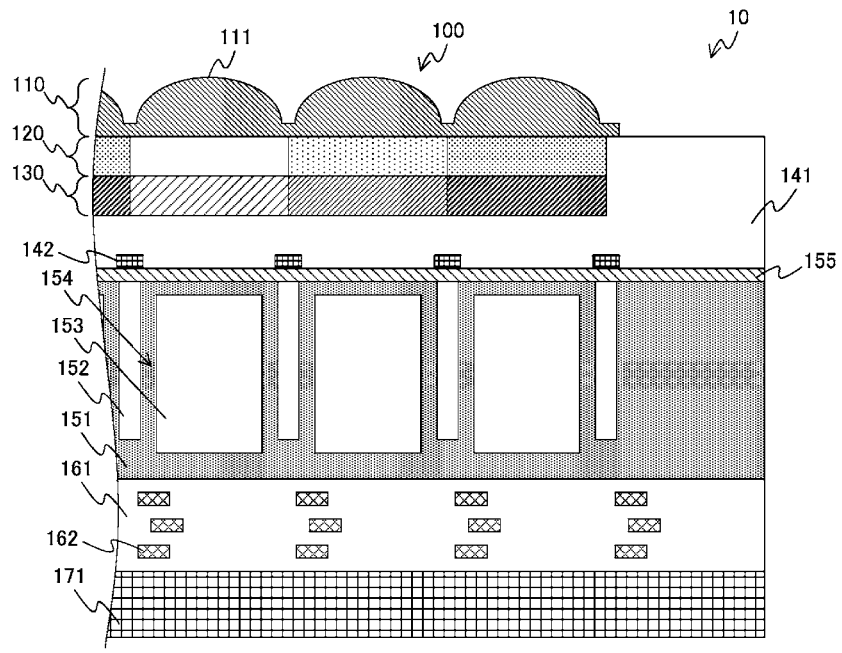

[Fig. 3A]
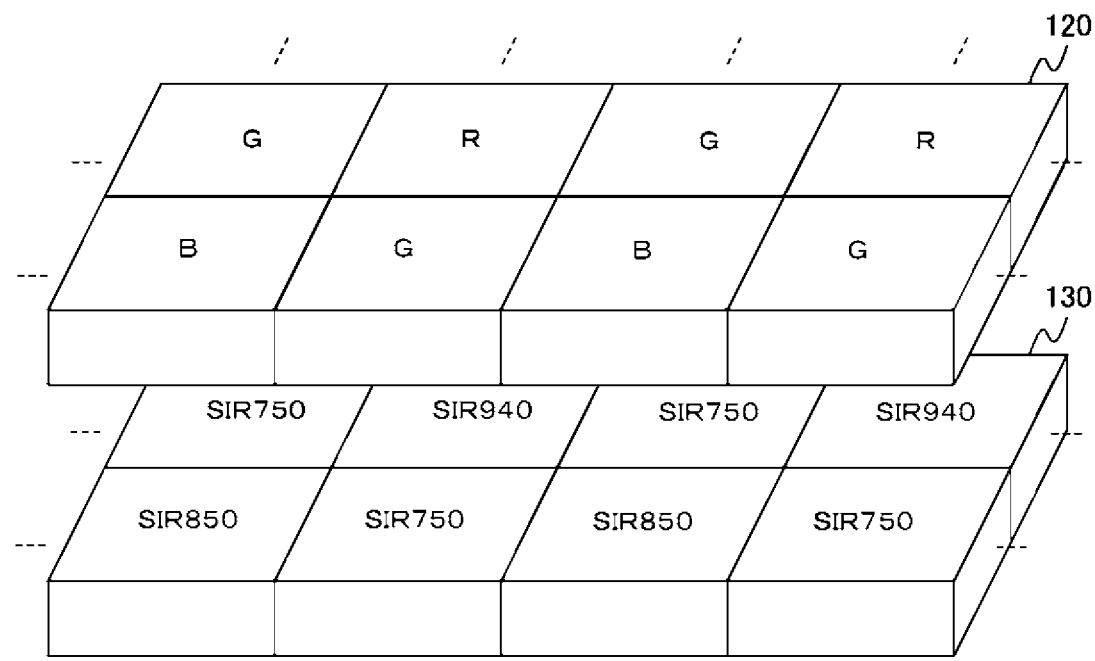
[Fig. 3B]
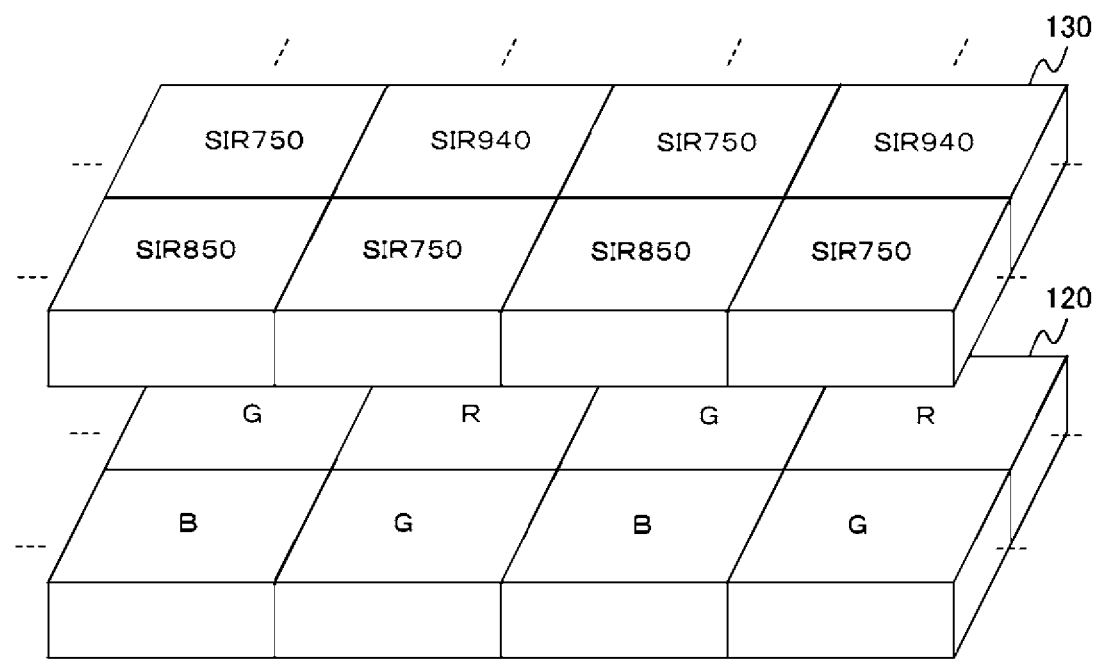

[Fig. 4]
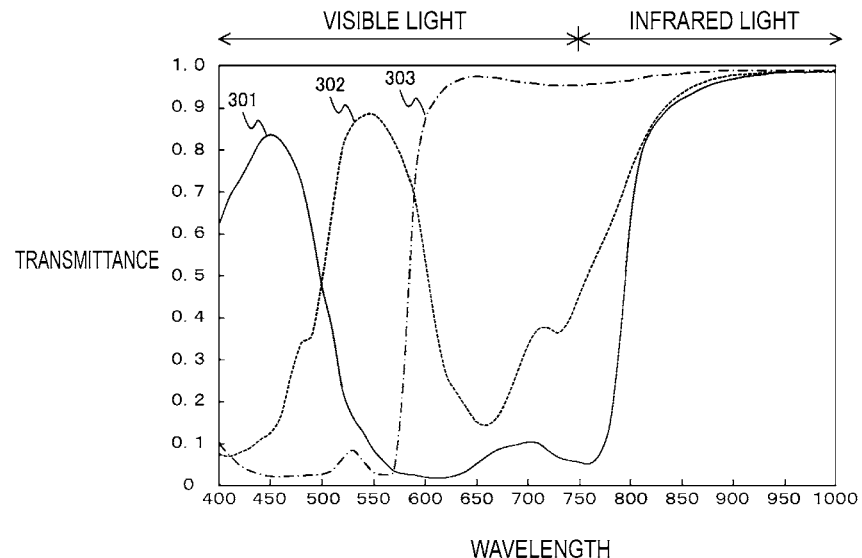
[Fig. 5]
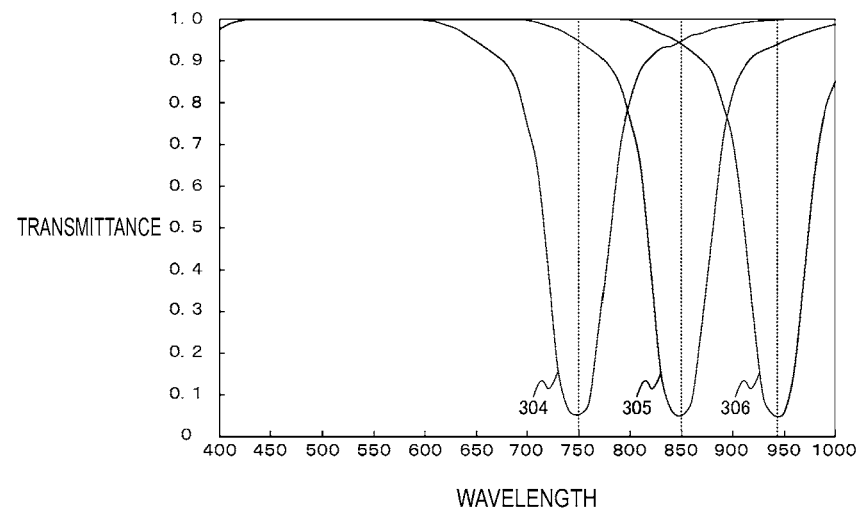
[Fig. 6A]
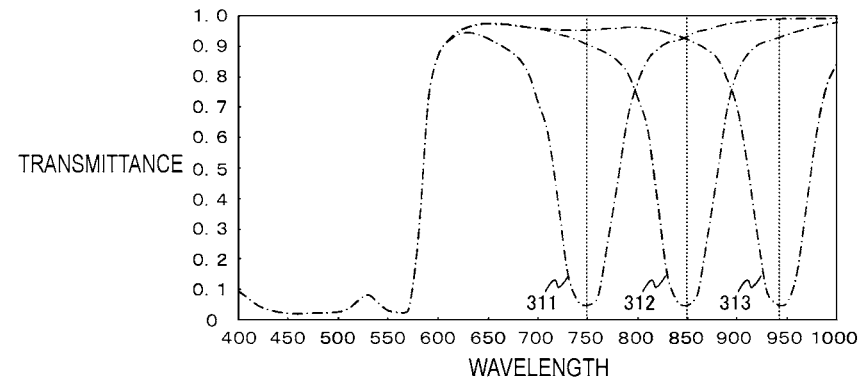

[Fig. 6B]
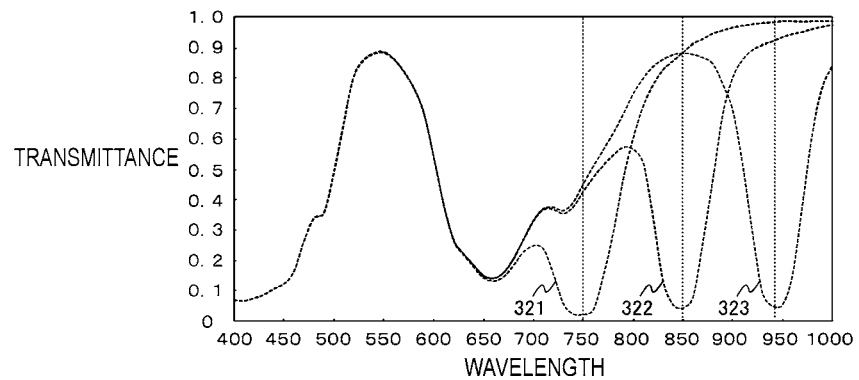
[Fig. 6C]
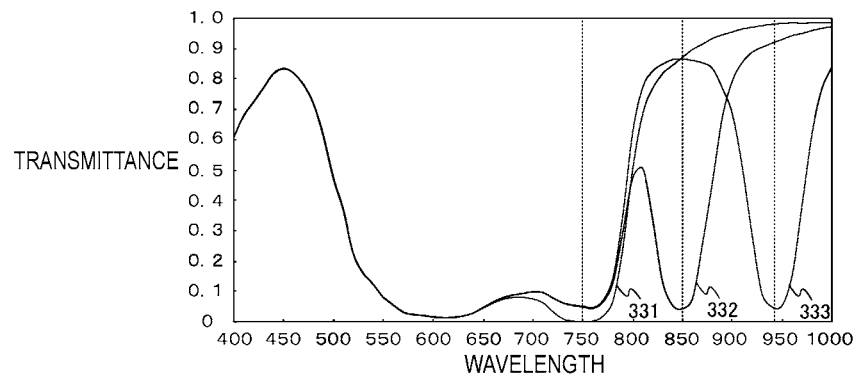
[Fig. 7]
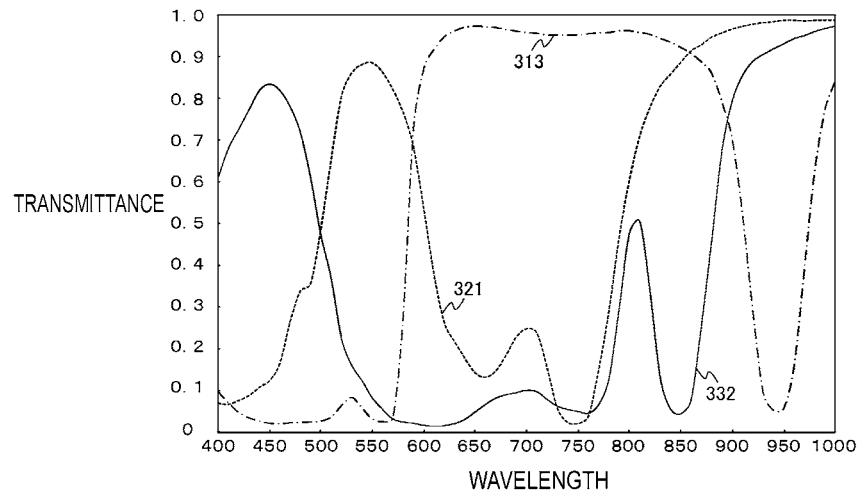

[Fig. 8]
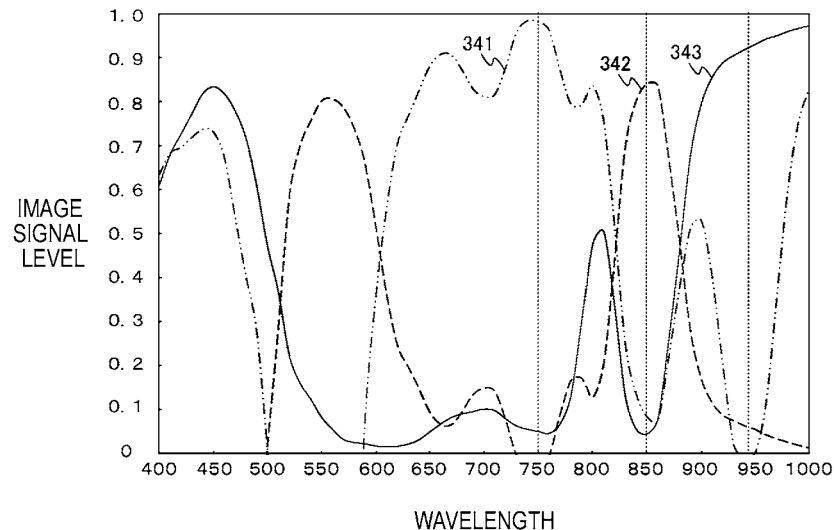
[Fig. 9]
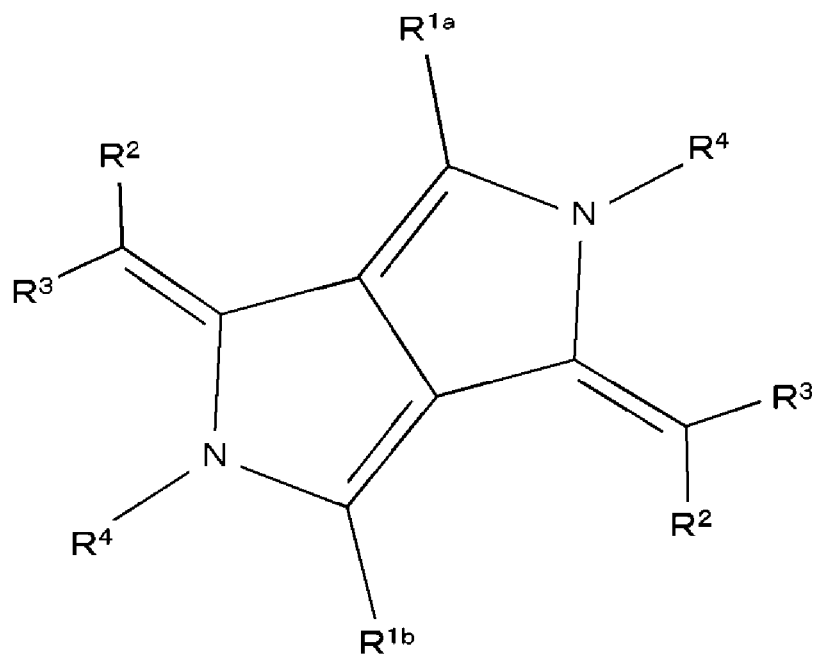

[Fig. 10]
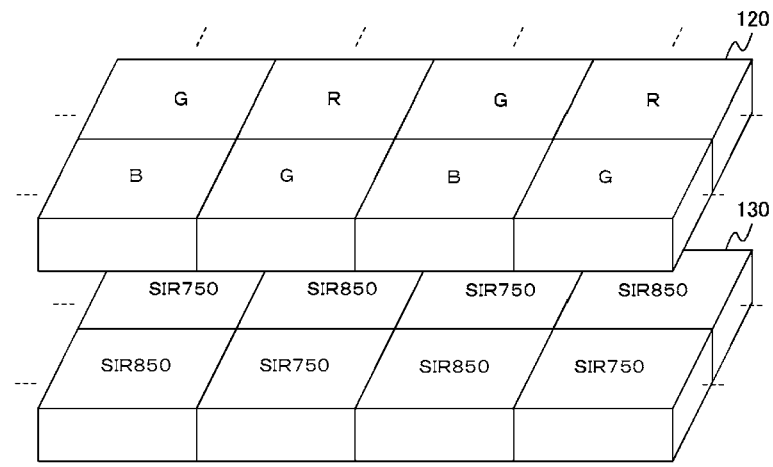
[Fig. 11]
| COLOR FILTER | GREEN | RED | BLUE |
|---|---|---|---|
| INFRARED LIGHT FILTER | 750 | 750 | 850 |
| | | | 940 |
| | | 850 | 750 |
| | | | 850 |
| | | 940 | 750 |
| | | | 940 |
| | 850 | 750 | 750 |
| | | | 850 |
| | | 850 | 750 |
| | | | 940 |
| | | 940 | 850 |
| | | | 940 |
| | 940 | 750 | 750 |
| | | | 940 |
| | | 850 | 850 |
| | | | 940 |
| | | 940 | 750 |
| | | | 850 |

[Fig. 12A]
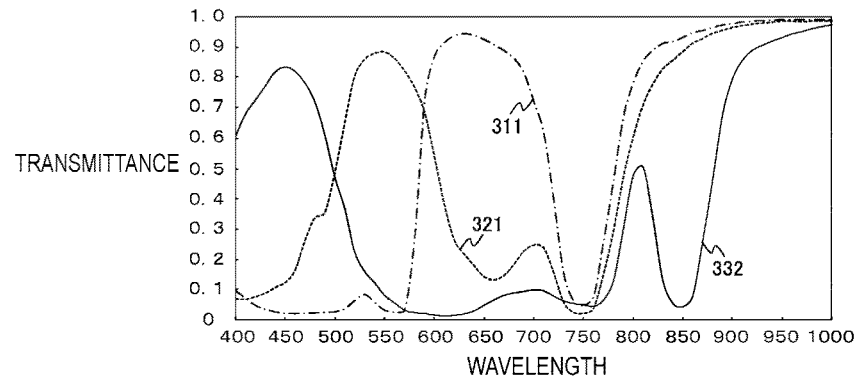
[Fig. 12B]
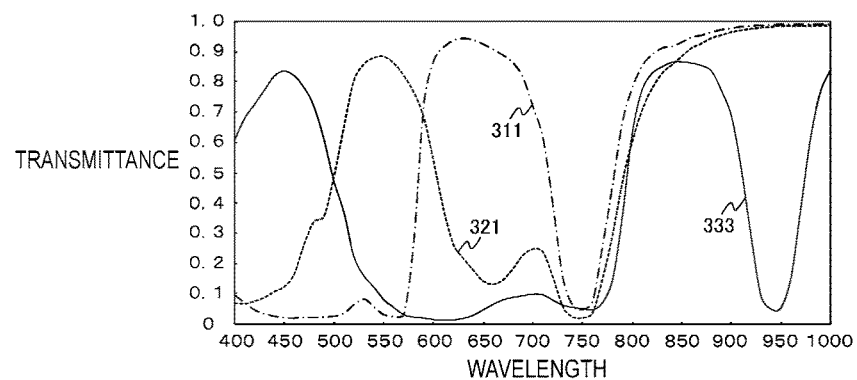
[Fig. 12C]
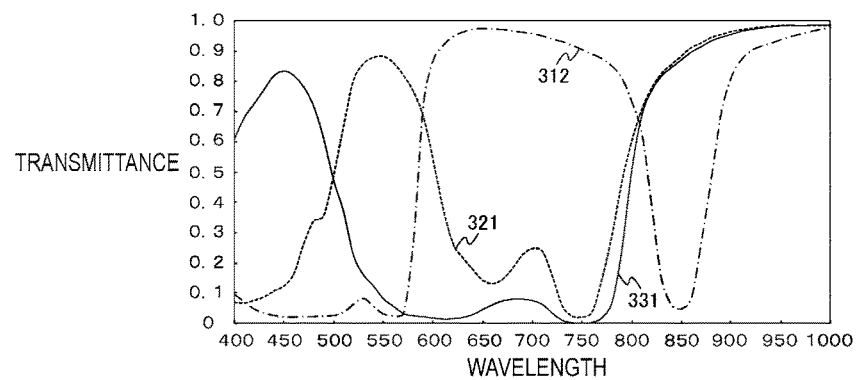
[Fig. 13A]
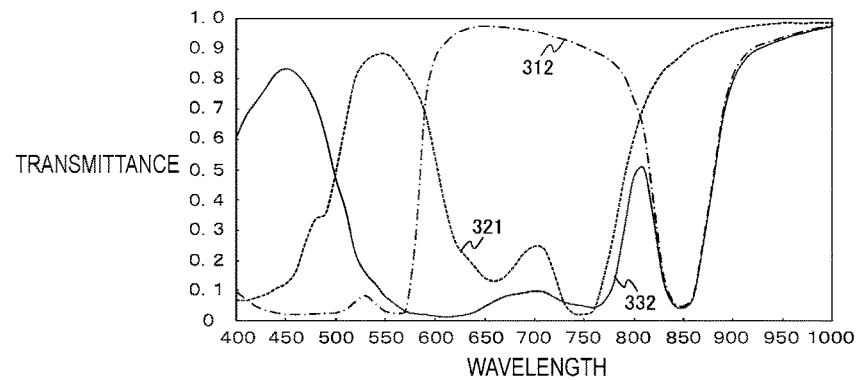

[Fig. 13B]
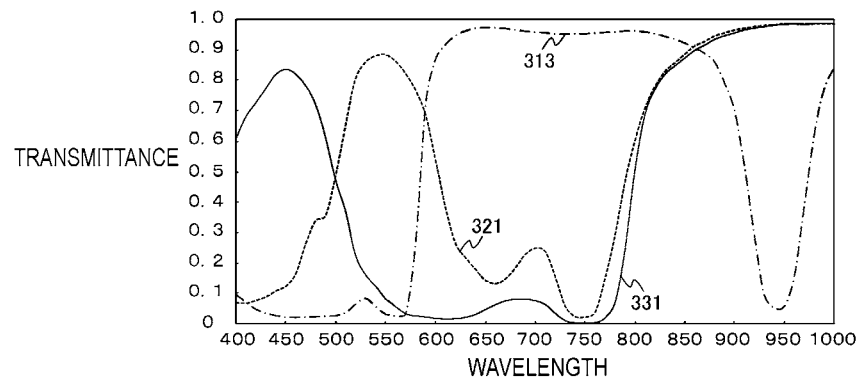
[Fig. 13C]
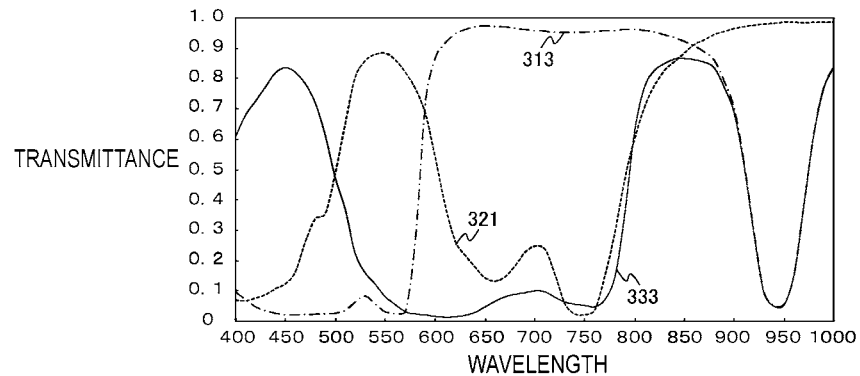
[Fig. 14A]
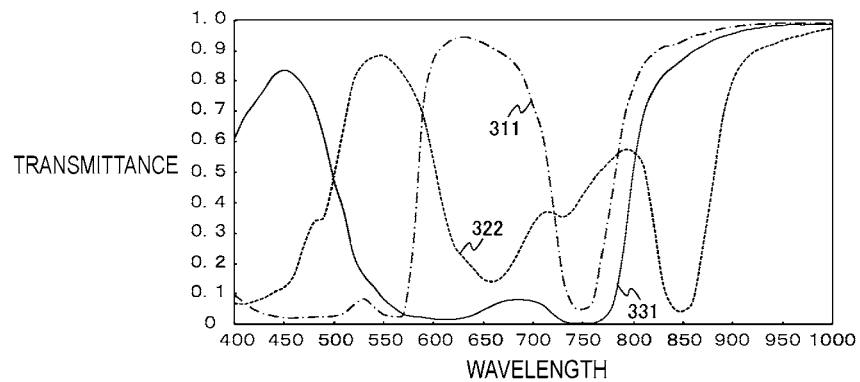
[Fig. 14B]
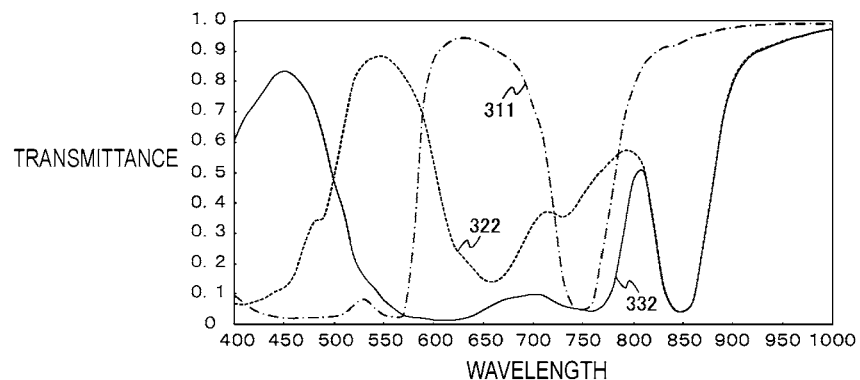

[Fig. 14C]
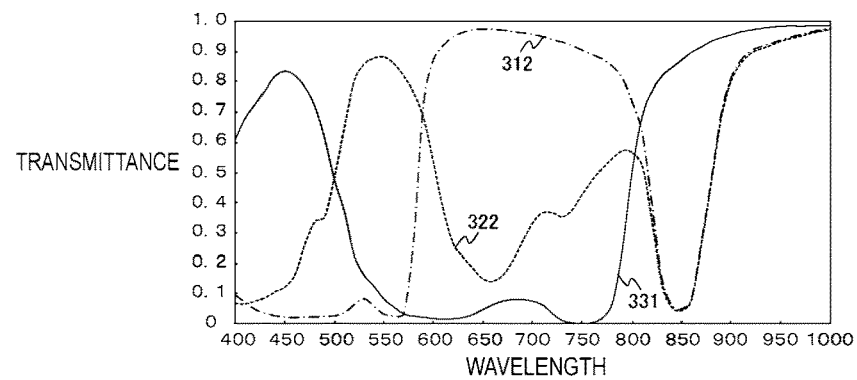
[Fig. 15A]
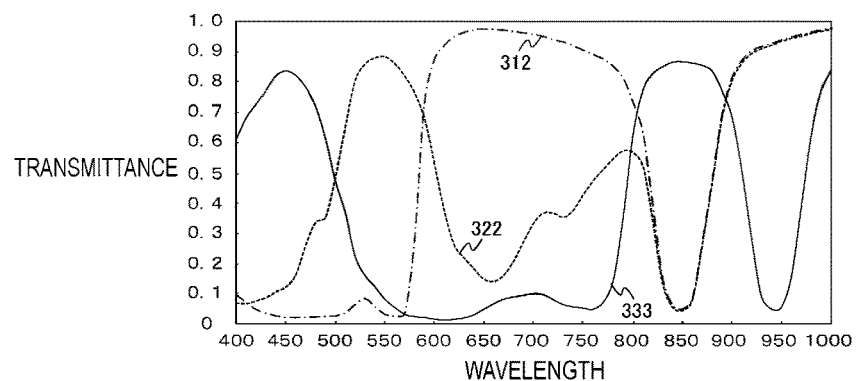
[Fig. 15B]
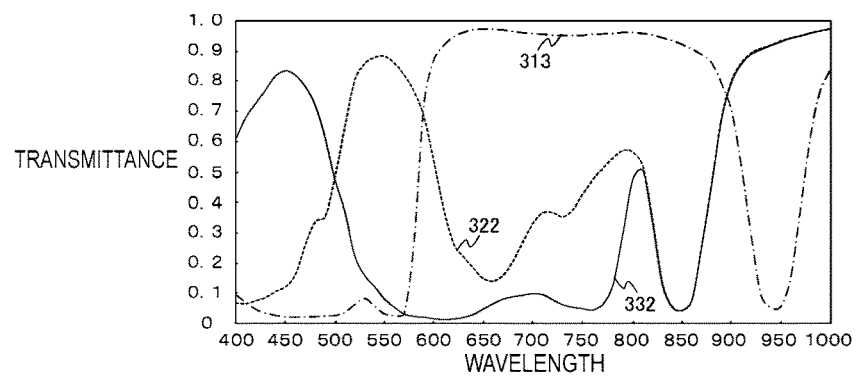
[Fig. 15C]
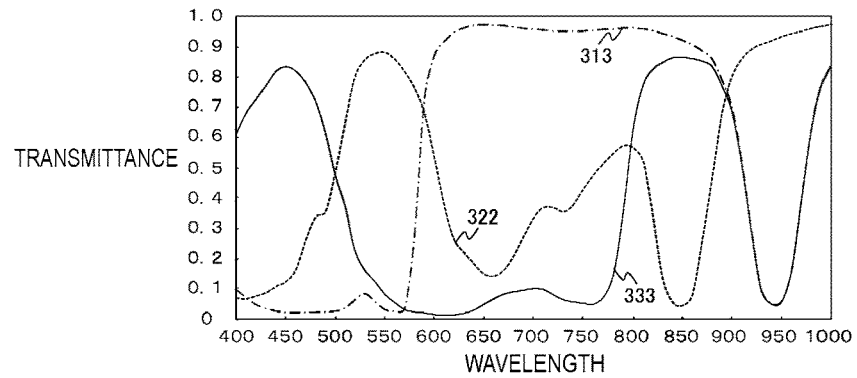

[Fig. 16A]
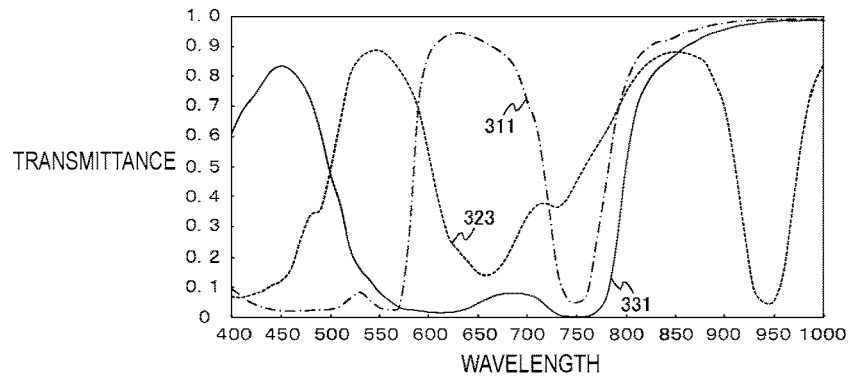
[Fig. 16B]
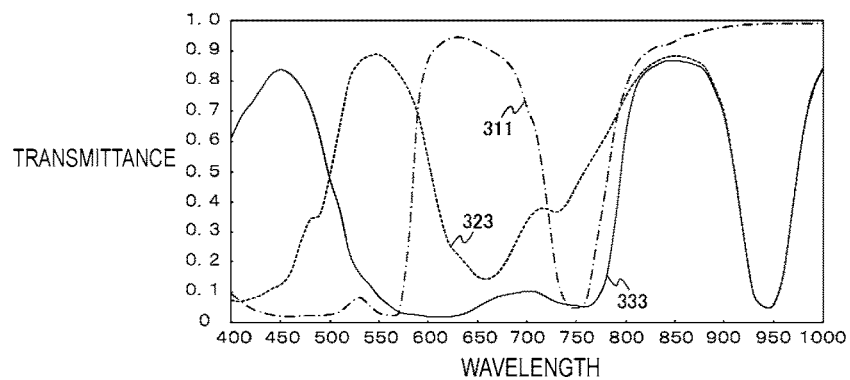
[Fig. 16C]
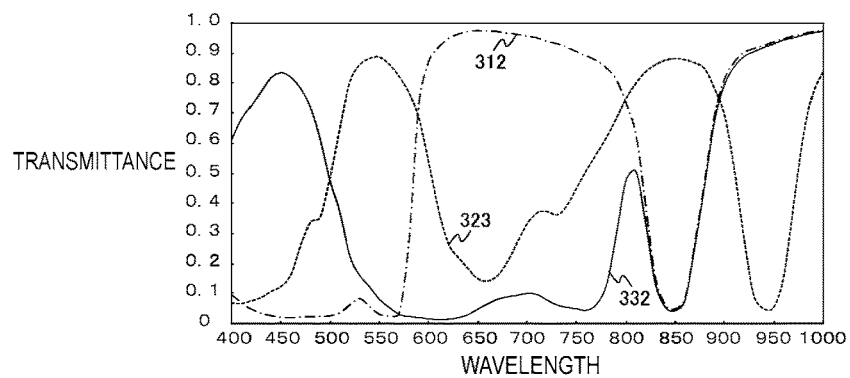
[Fig. 17A]
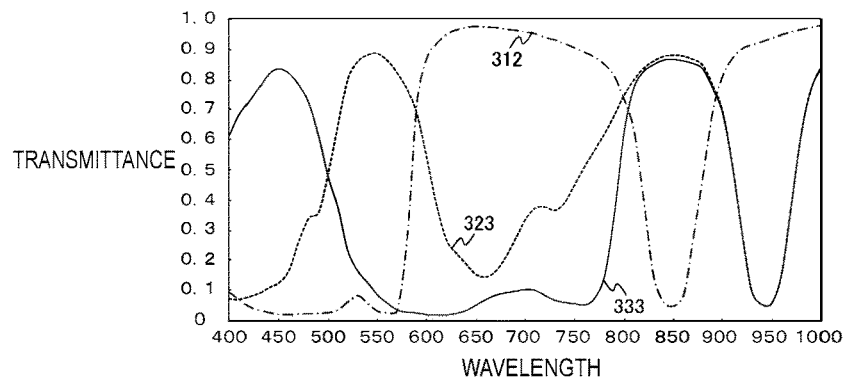

[Fig. 17B]
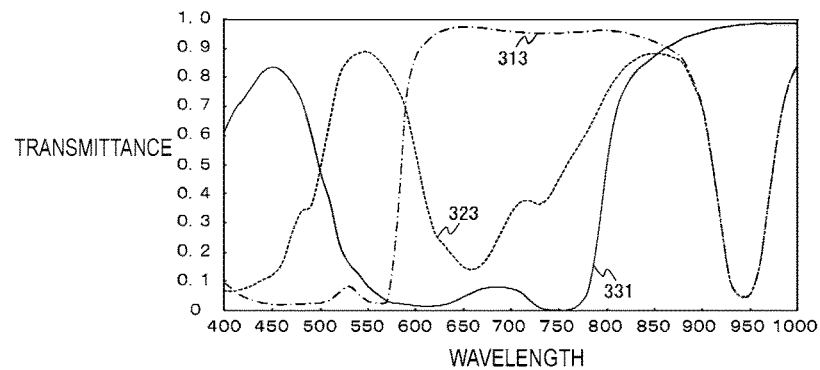
[Fig. 17C]
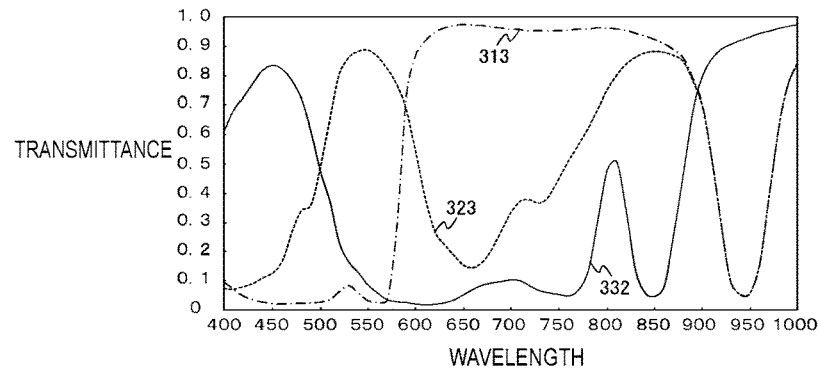
[Fig. 18A]
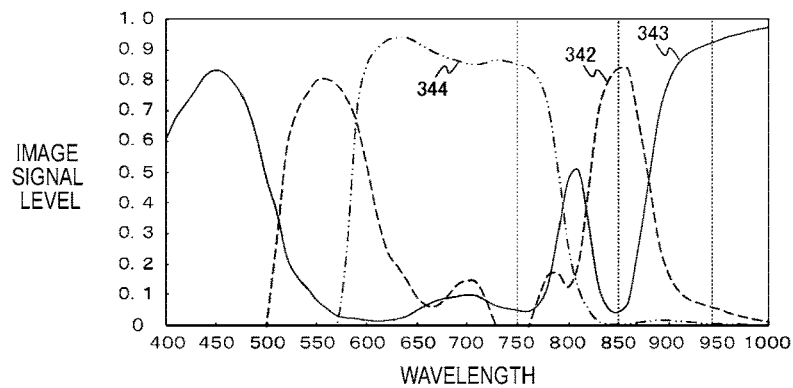
[Fig. 18B]
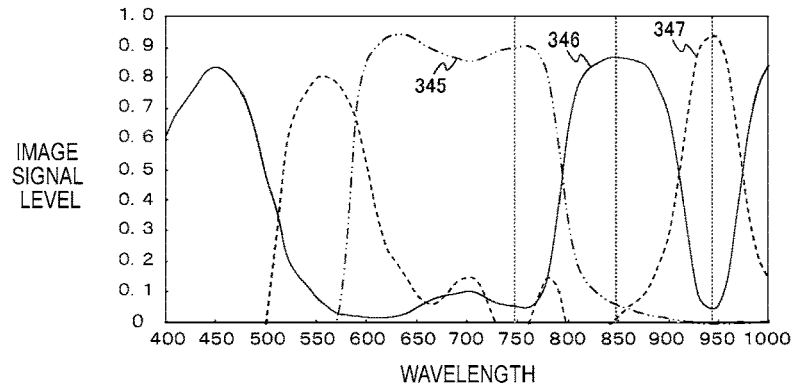

[Fig. 18C]
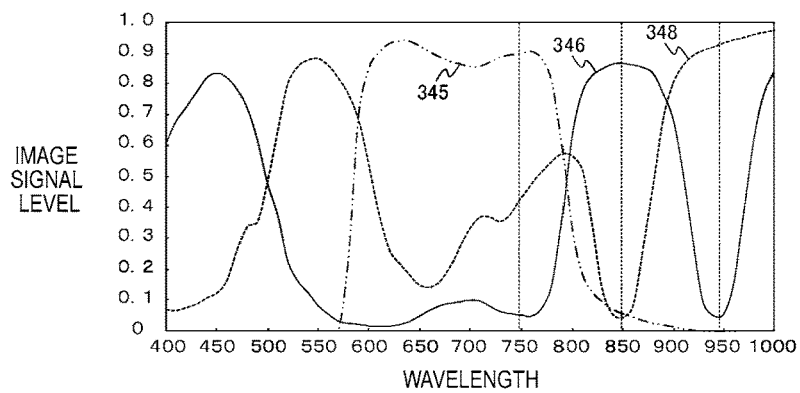
[Fig. 19A]
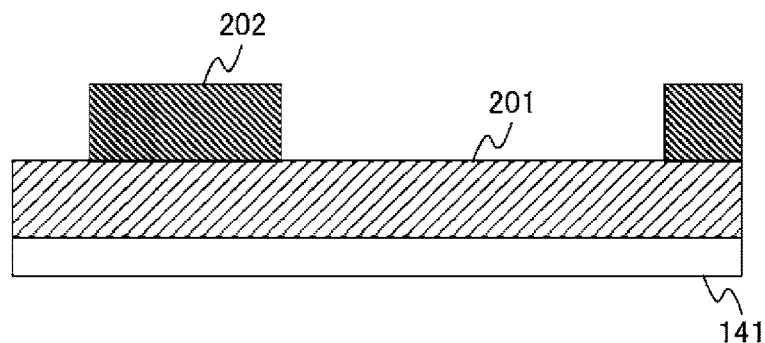
[Fig. 19B]
[Fig. 19C]
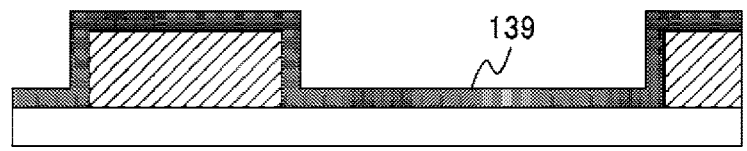
[Fig. 19D]
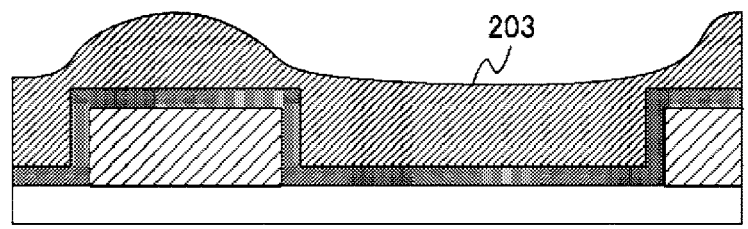

[Fig. 19E]
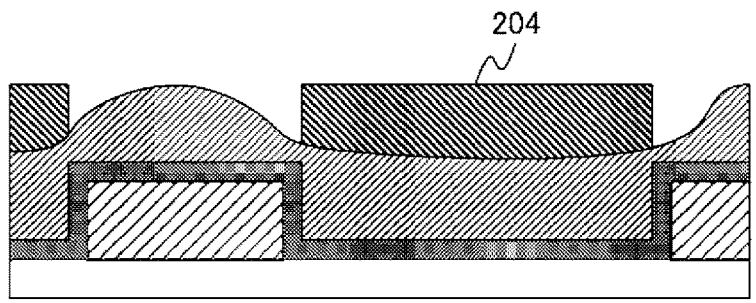
[Fig. 19F]
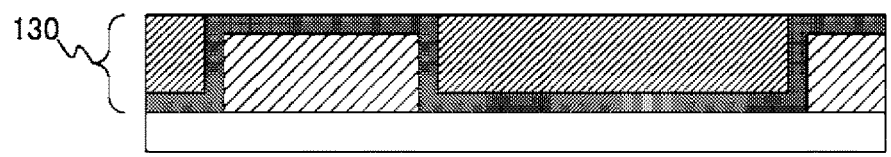
[Fig. 20A]
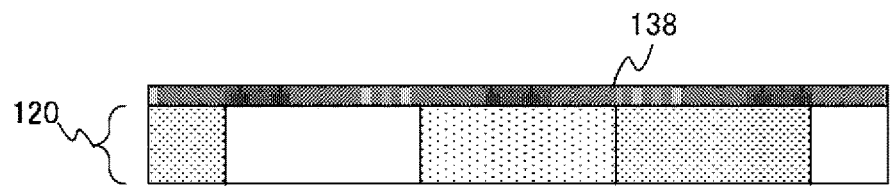
[Fig. 20B]
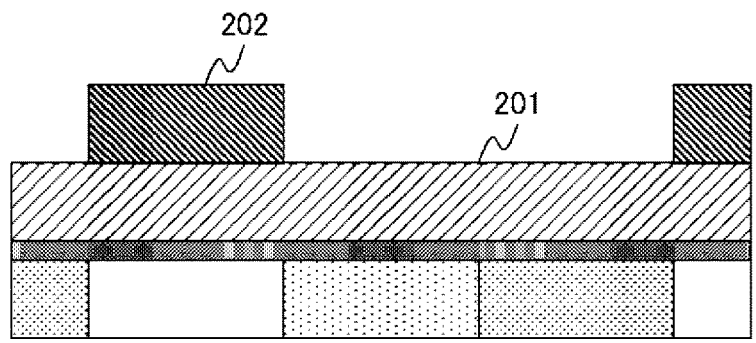
[Fig. 20C]
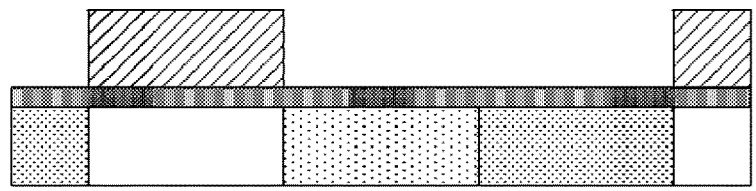

[Fig. 20D]
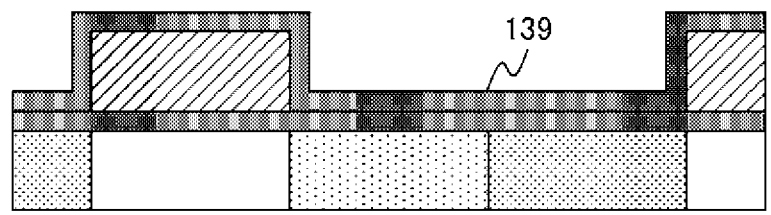
[Fig. 20E]
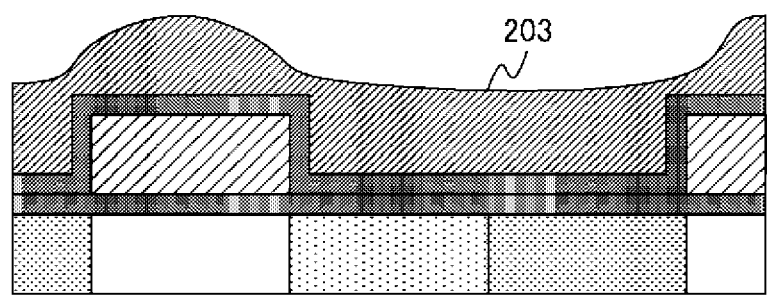
[Fig. 21A]
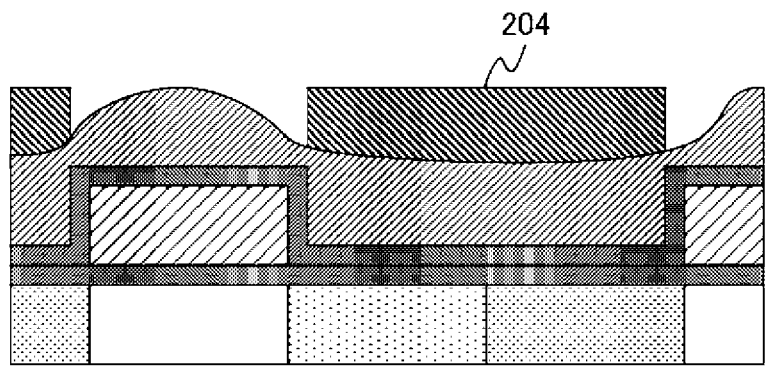
[Fig. 21B]
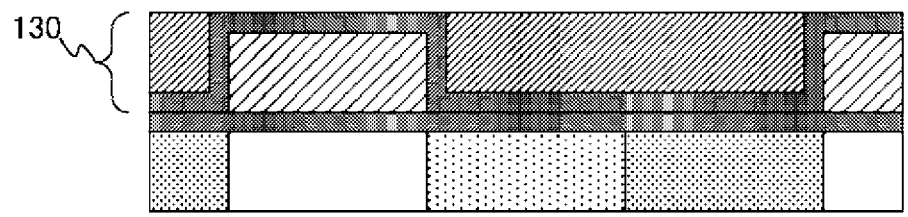

[Fig. 22]
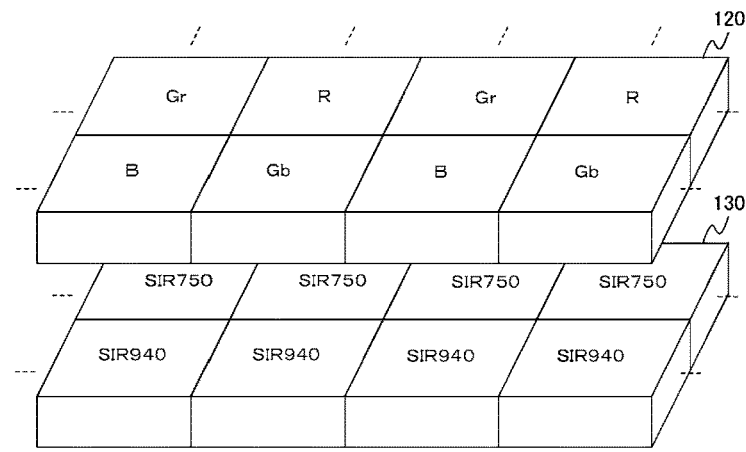
[Fig. 23]
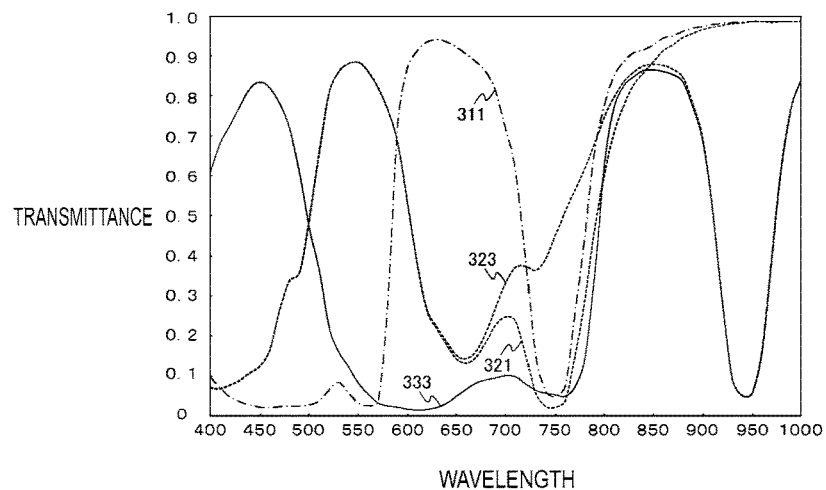
[Fig. 24]
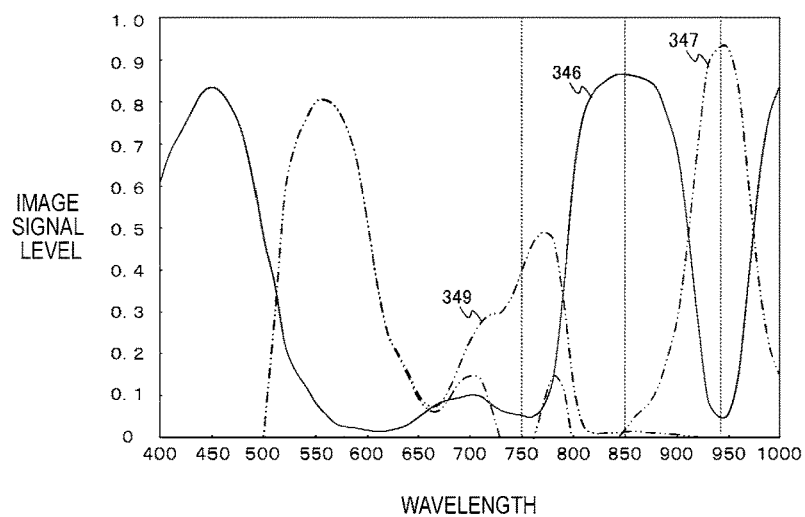

[Fig. 25]
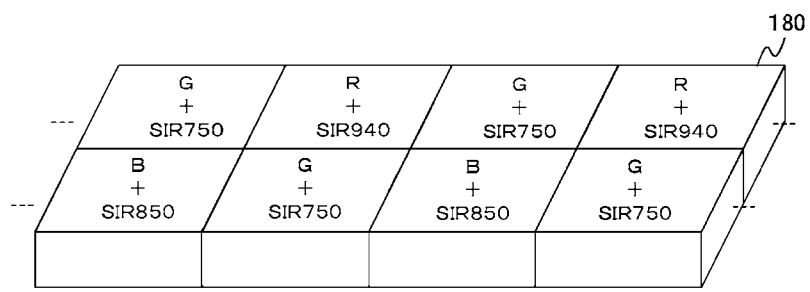
[Fig. 26]
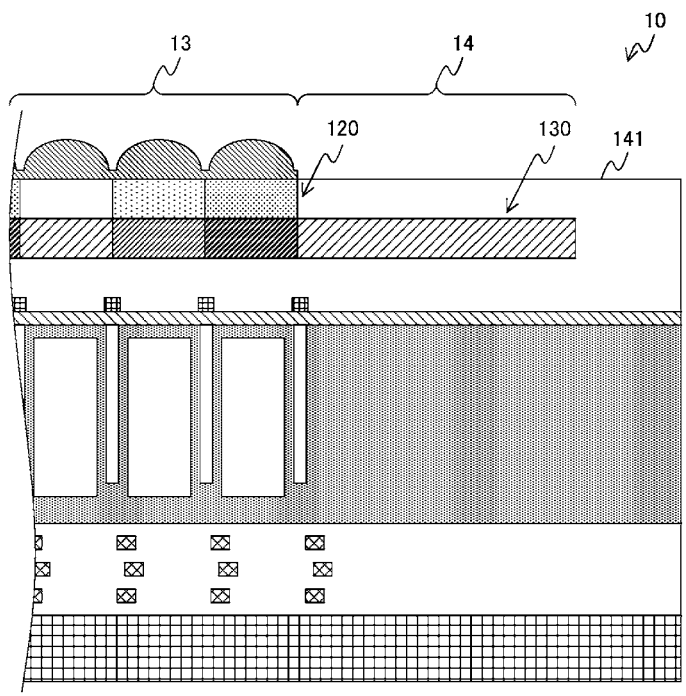

[Fig. 27]
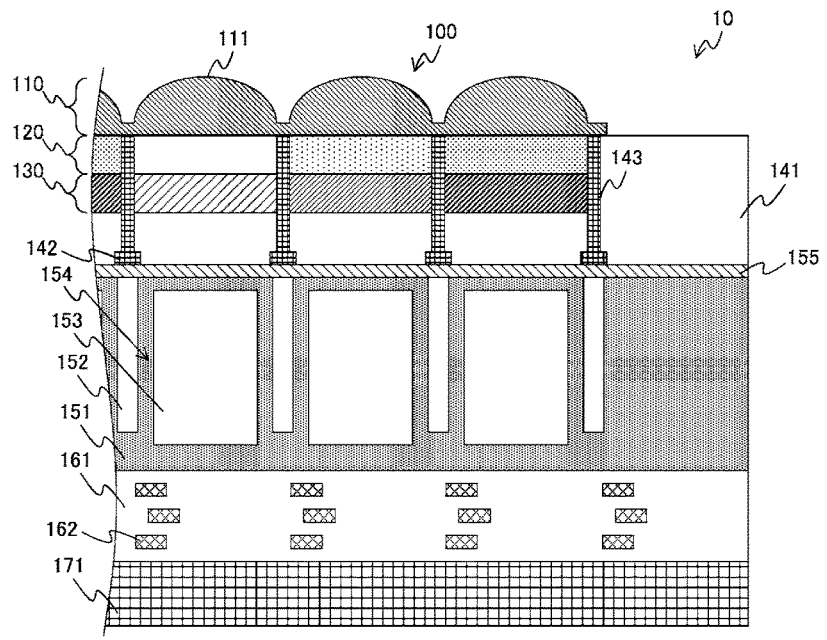
[Fig. 28A]
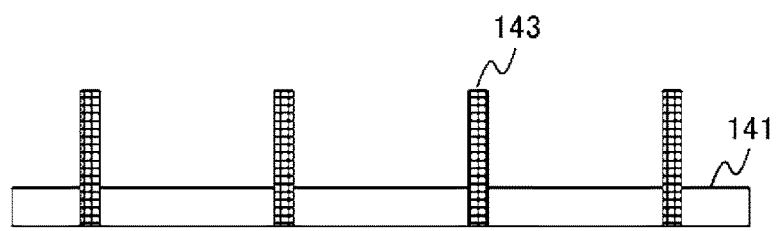
[Fig. 28B]
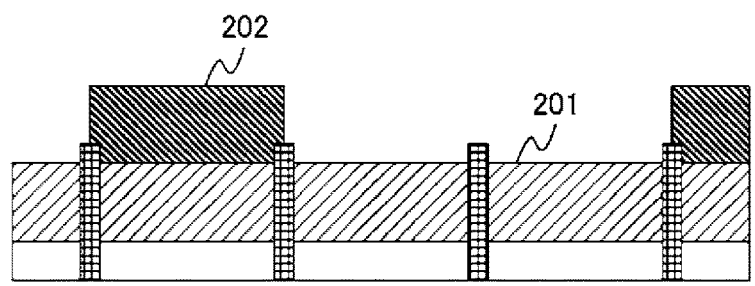
[Fig. 28C]

[Fig. 28D]
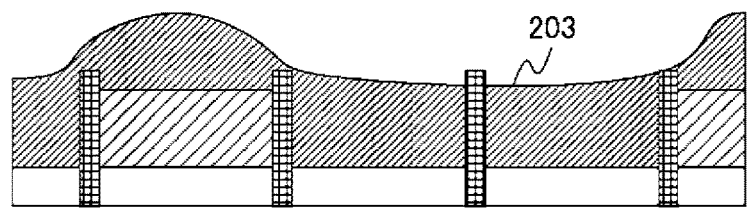
[Fig. 28E]
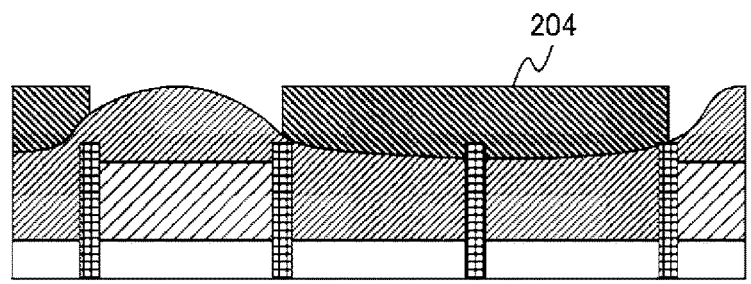
[Fig. 28F]
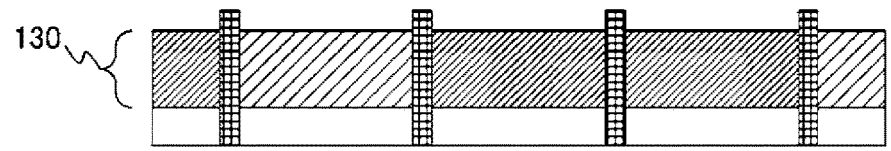
[Fig. 29]
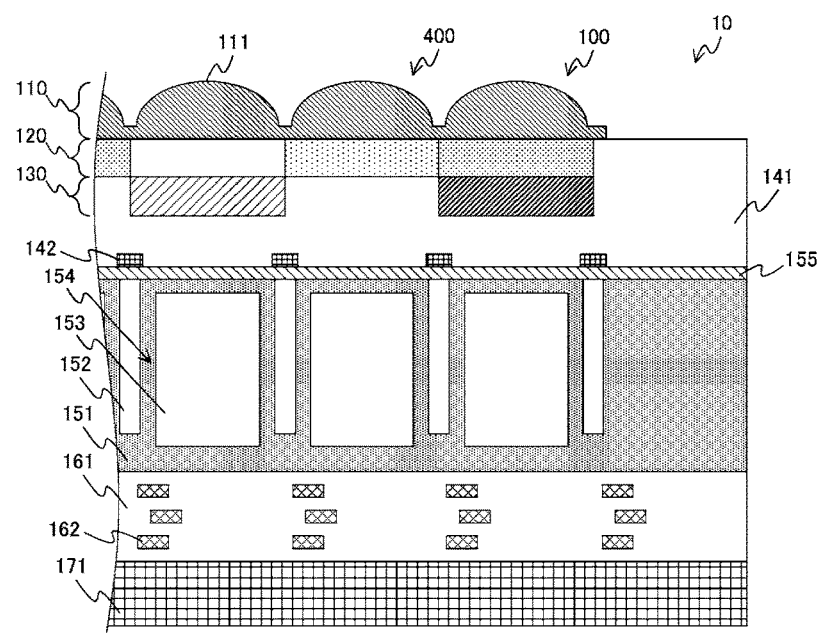

[Fig. 30A]
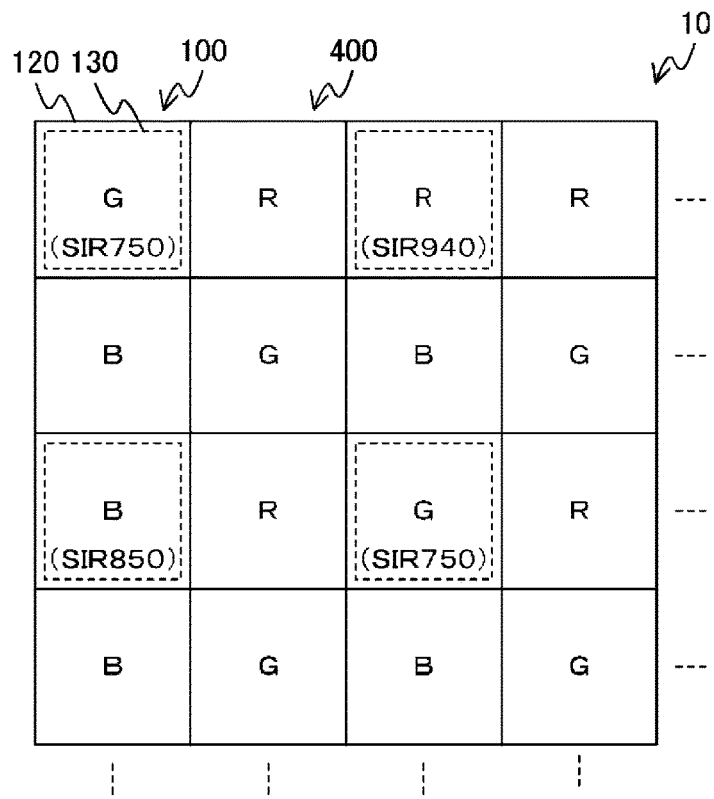
[Fig. 30B]
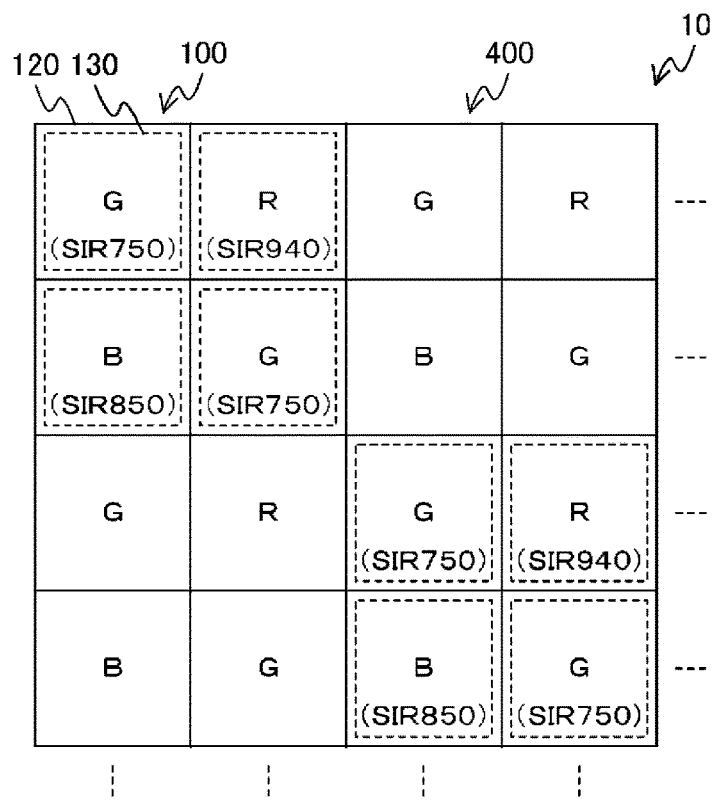

[Fig. 30C]
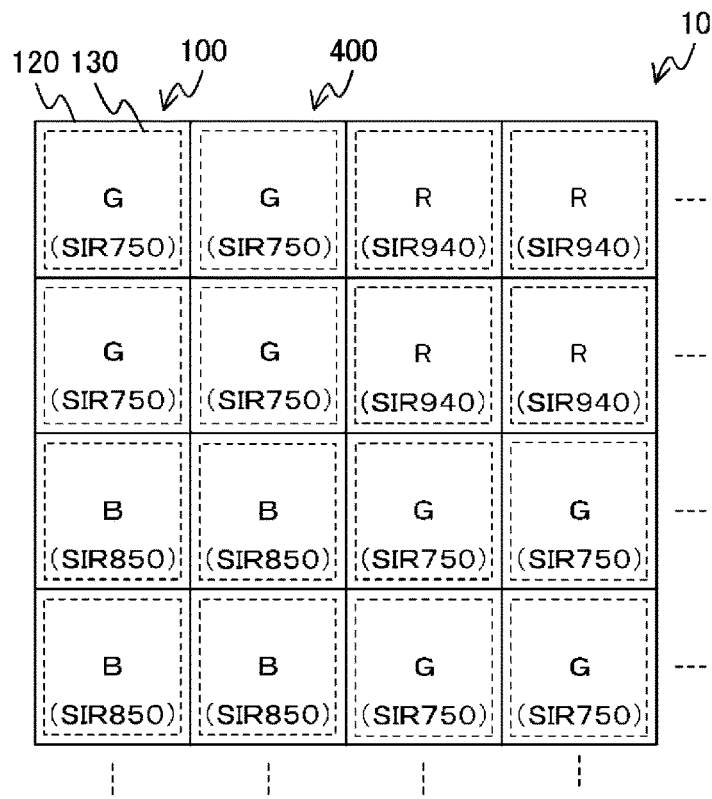
[Fig. 30D]
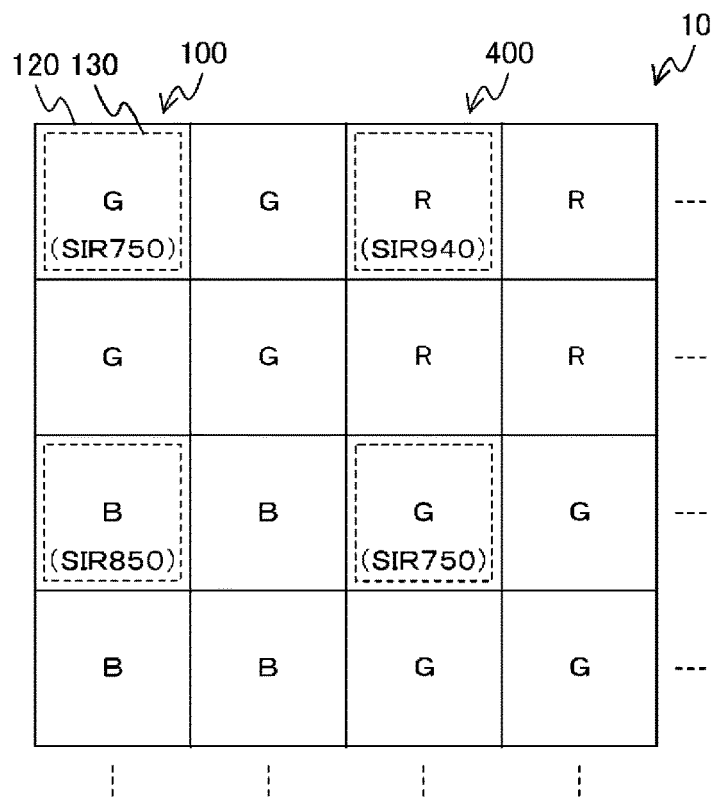

[Fig. 31A]
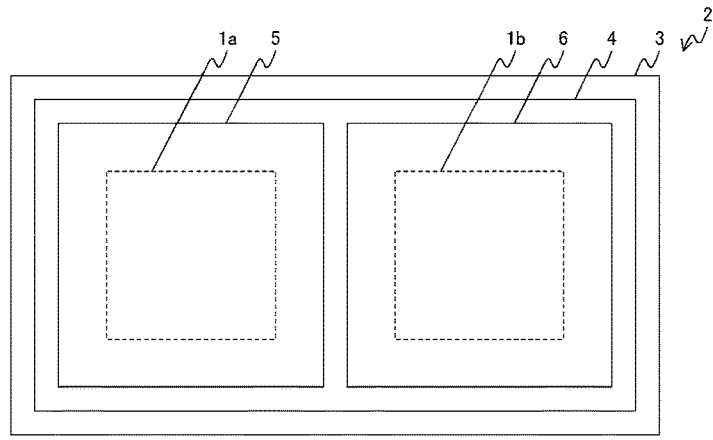
[Fig. 31B]
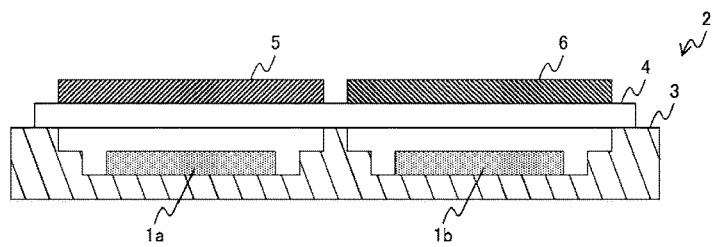
[Fig. 32A]
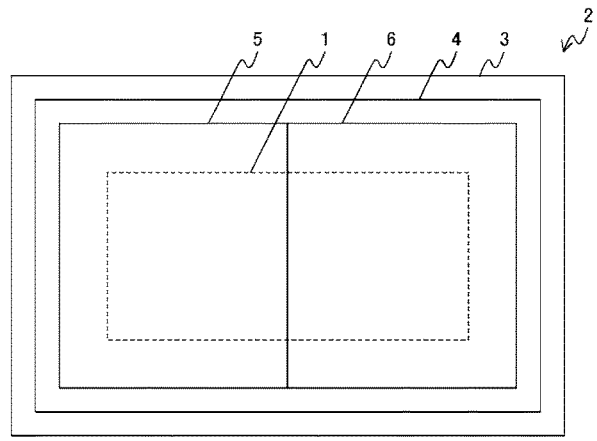
[Fig. 32B]
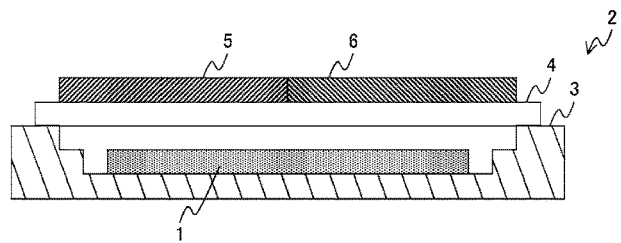

[Fig. 32C]
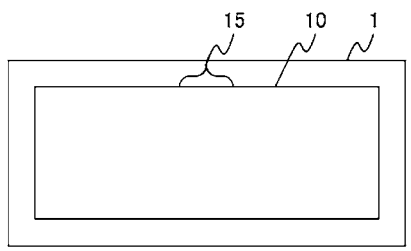
[Fig. 33]
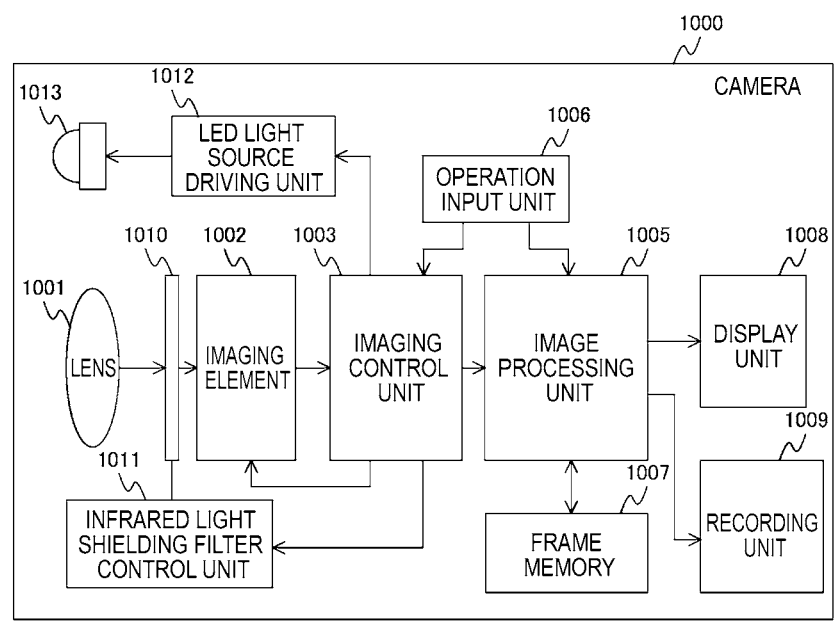

[Fig. 34]
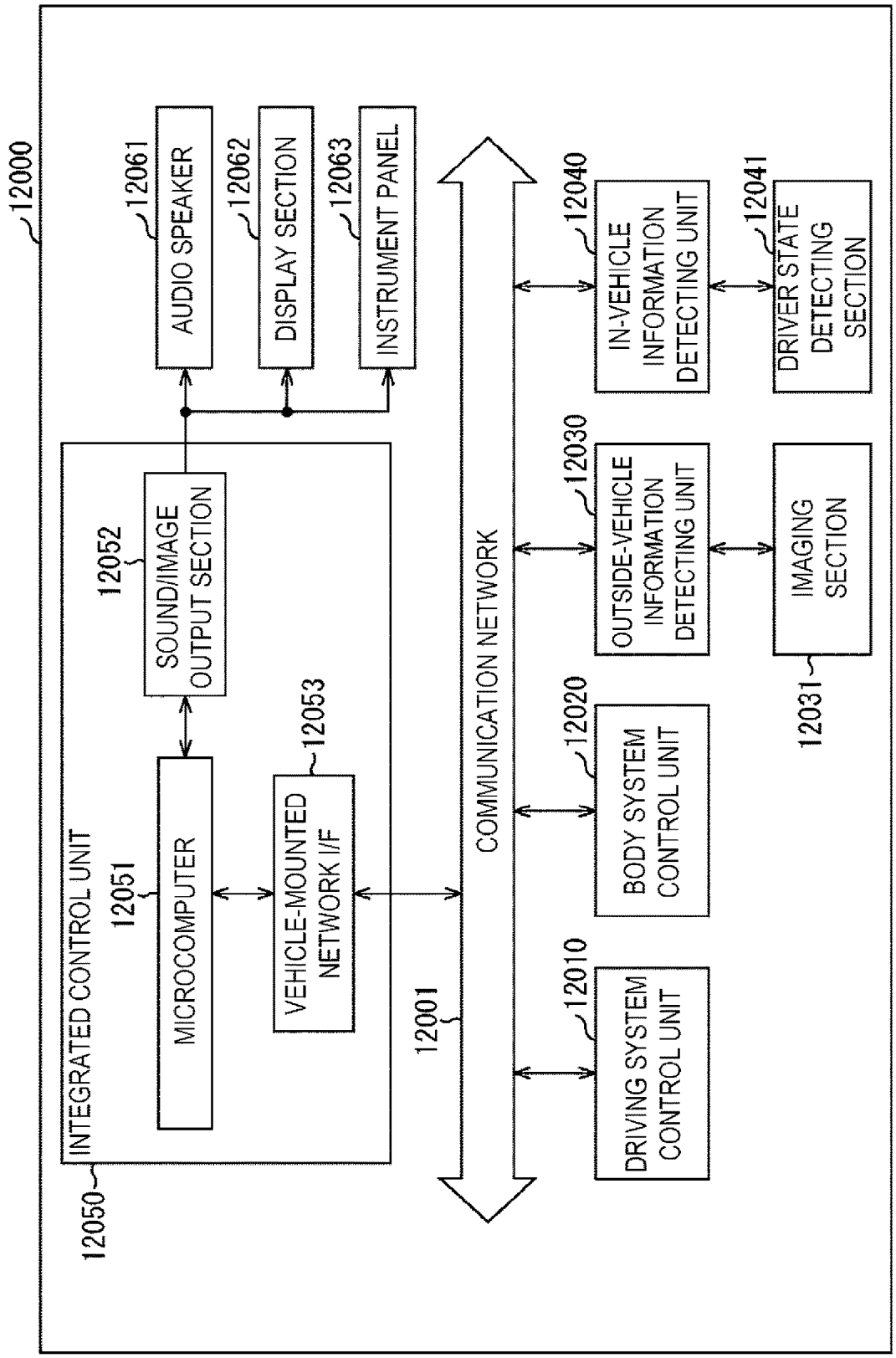

[Fig. 35]
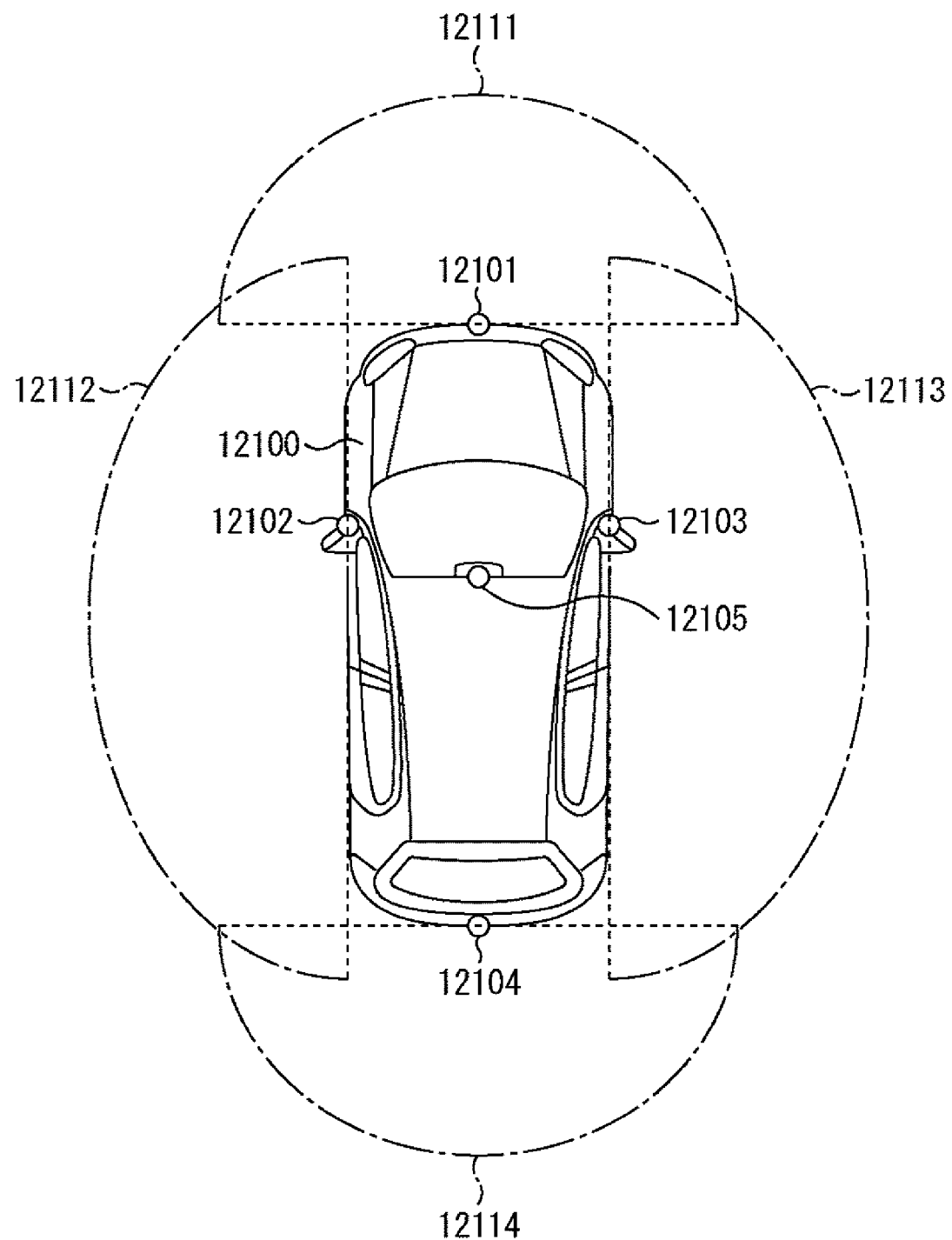

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2019/014159 having an international filing date of 29 Mar. 2019, which designated the United States, which PCT application claimed the benefit of Japanese Priority Patent Application JP 2018-068896 filed 30 Mar. 2018, the entire disclosures of each of which are incorporated herein by reference.

TECHNICAL FIELD

The present technology relates to an imaging element and an imaging apparatus. More particularly, the present technology relates to an imaging element and an imaging apparatus for performing imaging of infrared light.

BACKGROUND ART

In related art, an imaging apparatus that performs imaging by infrared light in a low illumination environment such as at nighttime is used. In such an imaging apparatus, in a case in which only a luminance signal is generated as an image signal based on the infrared light, a monochrome image is obtained. Since the monochrome image has low visibility, there is a problem that it is difficult to identify a subject such as a suspicious person in an application such as a surveillance camera. Therefore, an imaging apparatus which colorizes a monochrome image by coloring the monochrome image and promotes improvement of visibility or expressiveness with a natural color arrangement (for example, refer to PTL 1) has been proposed.

In the above-described imaging apparatus, an infrared image of light reflected from the subject irradiated with the infrared light is captured. In addition, a color image of light reflected from the subject onto which a pattern formed by combining visible laser light of a plurality of colors is projected is captured. Color information according to a reflected light intensity of the visible laser light of the plurality of colors is determined using the color image, and colors are imparted to the infrared image on the basis of the color information. Therefore, a colorized infrared image is generated.

CITATION LIST

Patent Literature

PTL 1: JP 2013-219560A

SUMMARY

Technical Problem

In the above-described technology in related art, it is necessary to acquire the infrared image while irradiating the subject with the infrared light, to capture the color image while irradiating the subject with the visible laser light, and to perform coloring of the infrared image by processing two such images for each region, and there is a problem that a configuration of the apparatus becomes complicated.

It is desirable to simplify a configuration of an imaging apparatus that generates a color image from an image obtained by imaging infrared light from a subject.

Solution to Problem

According to a first embodiment of the present technology, there is provided an imaging element including: a first pixel that includes a first color filter that transmits infrared light and transmits first visible light among visible light and a first infrared light filter that transmits the visible light and attenuates first infrared light among the infrared light, and generates an image signal according to light transmitted through the first color filter and the first infrared light filter; a second pixel that includes a second color filter that transmits the infrared light and transmits second visible light among the visible light and a second infrared light filter that transmits the visible light and attenuates second infrared light among the infrared light, and generates an image signal according to light transmitted through the second color filter and the second infrared light filter; and a third pixel that includes a third color filter that transmits the infrared light and transmits third visible light among the visible light and a third infrared light filter that transmits the visible light and attenuates third infrared light among the infrared light, and generates an image signal according to light transmitted through the third color filter and the third infrared light filter. Thus, an effect that a pixel having a filter that transmits the first visible light among the visible light and attenuates the first infrared light among the infrared light is disposed in the imaging element is obtained. In addition, an effect that a pixel having a filter that transmits the second visible light among the visible light and attenuates the second infrared light among the infrared light is disposed in the imaging element is further obtained. In addition, an effect that a pixel in which a filter that transmits the third visible light among the visible light and attenuates the third infrared light among the infrared light is disposed is disposed in the imaging element is further obtained. It is assumed that the image signal according to the first visible light, the second visible light, the third visible light, the first infrared light, the second infrared light, and the third infrared light is generated from the three pixels.

In addition, in this first embodiment, the first pixel may further include an on-chip lens that condenses light from a subject and causes the light from the subject to be transmitted through the first color filter and the first infrared light filter, the second pixel may further include an on-chip lens that condenses the light from the subject and causes the light from the subject to be transmitted through the second color filter and the second infrared light filter, and the third pixel may further include an on-chip lens that condenses the light from the subject and causes the light from the subject to be transmitted through the third color filter and the third infrared light filter. Thus, an effect that the on-chip lens condenses the light incident through the color filter and the infrared light filter is obtained.

In addition, according to a second embodiment of the present technology, there is provided an imaging element including: a first pixel that includes a first color filter that transmits infrared light and transmits first visible light among visible light and a first infrared light filter that transmits the visible light and attenuates first infrared light among the infrared light, and generates an image signal according to light transmitted through the first color filter and the first infrared light filter; a second pixel that includes a second color filter that transmits the infrared light and transmits second visible light among the visible light and a second infrared light filter that transmits the visible light and attenuates second infrared light among the infrared light, and generates an image signal according to light transmitted through the second color filter and the second infrared light filter; and a third pixel that includes a third color filter that transmits the infrared light and transmits third visible light among the visible light and any of the first infrared light filter and the second infrared light filter, and generates an image signal according to light transmitted through the third color filter and any of the first infrared light filter and the second infrared light filter. Thus, an effect that a pixel having a filter that transmits the first visible light among the visible light and attenuates the first infrared light among the infrared light is disposed in the imaging element is obtained. In addition, an effect that a pixel in which a filter that transmits the second visible light among the visible light and attenuates the second infrared light among the infrared light is disposed is disposed in the imaging element is further obtained. In addition, an effect that a pixel in which any of a filter that transmits the third visible light among the visible light and attenuates the first infrared light among the infrared light and a filter that attenuates the second infrared light is disposed in the imaging element is further obtained. It is assumed that the image signal according to the first visible light, the second visible light, the third visible light, the first infrared light, and the second infrared light is generated from the three pixels.

In addition, in this second embodiment, the first infrared light and the second infrared light may have wavelengths different from each other by at least 30 nm. Thus, an effect that the first infrared light and the second infrared light having wavelengths different from each other by at least 30 nm are attenuated by the infrared light filter is obtained.

In addition, in this second embodiment, the first infrared light and the second infrared light may have wavelengths of any of approximately 750 nm, 850 nm, and 940 nm. Thus, an effect that infrared light having at least two wavelengths of 750 nm, 850 nm, and 940 nm is attenuated is obtained.

In addition, in this second embodiment, the first pixel, the second pixel, and the third pixel may generate an image signal according to light having at least any one of wavelengths of approximately 750 nm, 850 nm, and 940 nm. Thus, an effect that the image signal according to the light including the wavelength of any of approximately 750 nm, 850 nm, and 940 nm is generated is obtained.

In addition, in this second embodiment, the first visible light, the second visible light, and the third visible light may be any of red light, green light, and blue light. Thus, an effect that the red light, the green light, and the blue light are transmitted through the color filter is obtained.

In addition, in this second embodiment, the first pixel, the second pixel, and the third pixel may be configured in a Bayer arrangement. Thus, an effect that the image signal is generated by the pixels configured in the Bayer arrangement is obtained.

In addition, in this second embodiment, the third visible light in the third pixel may be the green light, and two third pixels configured in the Bayer arrangement may include the first infrared light filter and the second infrared light filter different from each other. Thus, an effect that the infrared light having different wavelengths is attenuated in the pixel in which the color filter that transmits the green light in the Bayer arrangement is disposed is obtained.

In addition, in this second embodiment, a pixel region in which the first pixel, the second pixel, and the third pixel are disposed in a two-dimensional grid pattern; and a planarization film adjacent to at least one of the first infrared light filter or the second infrared light filter and disposed around the pixel region may be further included. Thus, an effect that the planarization film is disposed adjacent to the first infrared light filter or the second infrared light filter around the pixel region is obtained.

In addition, in this second embodiment, the planarization film may include at least one of the first infrared light filter or the second infrared light filter. Thus, an effect that the infrared light filter or the second infrared light filter is disposed in a region around the pixel region is obtained.

In addition, in this second embodiment, a light shielding portion that shields light between the first infrared light filter and the second infrared light filter in the adjacent second pixel and third pixel may be further included. Thus, an effect that the light shielding portion is disposed between the adjacent infrared light filters is obtained.

In addition, in this second embodiment, the first pixel may further include an on-chip lens that condenses light from a subject and causes the light from the subject to be transmitted through the first color filter and the first infrared light filter, the second pixel further includes an on-chip lens that condenses the light from the subject and causes the light from the subject to be transmitted through the second color filter and the second infrared light filter, and the third pixel may further include an on-chip lens that condenses the light from the subject and causes the light from the subject to be transmitted through the third color filter and any of the first infrared light filter and the second infrared light filter. Thus, an effect that the on-chip lens condenses the light incident through the color filter and the infrared light filter is obtained.

In addition, according to a third embodiment of the present technology, there is provided an imaging element including: a first pixel that includes a first filter that performs band pass type filtering of transmitting first visible light in a visible light region and performs band removal type filtering of attenuating first infrared light in an infrared light region, and generates an image signal according to light transmitted through the first filter; a second pixel that includes a second filter that performs band pass type filtering of transmitting second visible light in the visible light region and performs band removal type filtering of attenuating second infrared light in the infrared light region, and generates an image signal according to light transmitted through the second filter; and a third pixel that includes a third filter that performs band pass type filtering of transmitting third visible light in the visible light region and performs band removal type filtering of attenuating any of the first infrared light and the second infrared light in the infrared light region, and generates an image signal according to light transmitted through the third filter. Thus, an effect that a pixel having a filter that transmits the first visible light among the visible light and attenuates the first infrared light among the infrared light is disposed in the imaging element is obtained. In addition, an effect that a pixel in which a filter that transmits the second visible light among the visible light and attenuates the second infrared light among the infrared light is disposed is disposed in the imaging element is further obtained. In addition, an effect that a pixel in which any of a filter that transmits the third visible light among the visible light and attenuates the first infrared light among the infrared light and a filter that attenuates the second infrared light is disposed is disposed in the imaging element is further obtained. It is assumed that the image signal according to the first visible light, the second visible light, the third visible light, the first infrared light, and the second infrared light is generated from the three pixels.

In addition, in this third embodiment, the first pixel may further include an on-chip lens that condenses light from a subject and causes the light from the subject to be transmitted through the first filter, the second pixel may further include an on-chip lens that condenses the light from the subject and causes the light from the subject to be transmitted through the second filter, and the third pixel may further include an on-chip lens that condenses the light from the subject and causes the light from the subject to be transmitted through the third filter. Thus, an effect that the on-chip lens condenses the light incident through the color filter and the infrared light filter is obtained.

In addition, according to a fourth embodiment of the present technology, there is provided an imaging apparatus including: a first pixel that includes a first color filter that transmits infrared light and transmits first visible light among visible light and a first infrared light filter that transmits the visible light and attenuates first infrared light among the infrared light, and generates a first image signal that is an image signal according to light transmitted through the first color filter and the first infrared light filter; a second pixel that includes a second color filter that transmits the infrared light and transmits second visible light among the visible light and a second infrared light filter that transmits the visible light and attenuates second infrared light among the infrared light, and generates a second image signal that is an image signal according to light transmitted through the second color filter and the second infrared light filter; a third pixel that includes a third color filter that transmits the infrared light and transmits third visible light among the visible light and any of the first infrared light filter and the second infrared light filter, and generates a third image signal that is an image signal according to light transmitted through the third color filter and any of the first infrared light filter and the second infrared light filter; and a processing circuit that generates a first infrared light signal that is an image signal according to the first infrared light, a second infrared light signal that is an image signal according to the second infrared light, and a third infrared light signal that is an image signal according to infrared light different from the first infrared light and the second infrared light, on the basis of the generated first image signal, the generated second image signal, and the generated third image signal. Thus, an effect that a pixel having a filter that transmits the first visible light among the visible light and attenuates the first infrared light among the infrared light is disposed in the imaging element is obtained. In addition, an effect that a pixel in which a filter that transmits the second visible light among the visible light and attenuates the second infrared light among the infrared light is disposed is disposed in the imaging element is further obtained. In addition, an effect that a pixel in which any of a filter that transmits the third visible light among the visible light and attenuates the first infrared light among the infrared light and a filter that attenuates the second infrared light is disposed is disposed in the imaging element is further obtained. In addition, an effect that the image signal according to the first visible light, the second visible light, the third visible light, the first infrared light, and the second infrared light is generated from the three pixels is obtained.

In addition, in the fourth embodiment of the present technology, the processing circuit may generate the first infrared light signal, the second infrared light signal, and the third infrared light signal on the basis of a mutual difference between the generated first image signal, the generated second image signal, and the generated third image signal. Thus, an effect that the first, second and third infrared light signals are generated by the mutual differences between the first, second and third image signals is obtained.

In addition, in the fourth embodiment of the present technology, a light source that irradiates a subject with the infrared light may be further included. Thus, an effect that the subject is irradiated with the infrared light from the light source is obtained.

In addition, in the fourth embodiment of the present technology, the light source may emit the infrared light including the first infrared light and the second infrared light. Thus, an effect that the subject is irradiated with the first infrared light and the second infrared light is obtained.

In addition, in the fourth embodiment of the present technology, an infrared light shielding filter that shields the infrared light; and an infrared light shielding filter control unit that controls incidence of the infrared light on the first pixel, the second pixel, and the third pixel by inserting the infrared light shielding filter in an optical path between a subject and the first pixel, the second pixel, and the third pixel may be further included. The processing circuit may generate an image signal according to the first visible light, an image signal according to the second visible light, and an image signal according to the third visible light on the basis of the generated first image signal, the generated second image signal, and the generated third image signal when the infrared light shielding filter is inserted into the optical path by the infrared light shielding filter control unit. Thus, an effect that the infrared light is shielded when the image signal according to the first visible light, the second visible light, and the third visible light is generated is obtained.

In addition, in this fourth embodiment, the first pixel may further include an on-chip lens that condenses light from a subject and causes the light from the subject to be transmitted through the first color filter and the first infrared light filter, the second pixel may further include an on-chip lens that condenses the light from the subject and causes the light from the subject to be transmitted through the second color filter and the second infrared light filter, and the third pixel may further include an on-chip lens that condenses the light from the subject and causes the light from the subject to be transmitted through the third color filter and any of the first infrared light filter and the second infrared light filter. Thus, an effect that the on-chip lens condenses the light incident through the color filter and the infrared light filter is obtained.

In addition, according to a fifth embodiment of the present technology, there is provided an imaging element including: an on-chip lens unit; a light reception unit; a first filter layer disposed between the on-chip lens unit and the light reception unit; and a second filter layer disposed between the on-chip lens unit and the light reception unit. The on-chip lens unit includes a first on-chip lens, a second on-chip lens, and a third on-chip lens, the first filter layer includes a first color filter that transmits infrared light and transmits first visible light among visible light, a second color filter that transmits the infrared light and transmits second visible light among the visible light, and a third color filter that transmits the infrared light and transmits third visible light among the visible light, the second filter layer includes a first infrared light filter that transmits the visible light and attenuates first infrared light among the infrared light, a second infrared light filter that transmits the visible light and attenuates second infrared light among the infrared light, and a third infrared light filter that transmits the visible light and attenuates third infrared light among the infrared light, the light reception unit includes a first photoelectric conversion unit, a second photoelectric conversion unit, and a third photoelectric conversion unit, the first color filter and the first infrared light filter are disposed between the first on-chip lens and the first photoelectric conversion unit, the second color filter and the second infrared light filter are disposed between the second on-chip lens and the second photoelectric conversion unit, and the third color filter and the third infrared light filter are disposed between the third on-chip lens and the third photoelectric conversion unit. Thus, an effect that the color filter and the infrared light filter are disposed between the on-chip lens and the photoelectric conversion unit is obtained.

In addition, according to a sixth embodiment of the present technology, there is provided an imaging element including: an on-chip lens unit; a light reception unit; a first filter layer disposed between the on-chip lens unit and the light reception unit; and a second filter layer disposed between the on-chip lens unit and the light reception unit. The on-chip lens unit includes a first on-chip lens, a second on-chip lens, and a third on-chip lens, the first filter layer includes a first color filter that transmits infrared light and transmits first visible light among visible light, a second color filter that transmits the infrared light and transmits second visible light among the visible light, and a third color filter that transmits the infrared light and transmits third visible light among the visible light, the second filter layer includes a first infrared light filter that transmits the visible light and attenuates first infrared light among the infrared light, a second infrared light filter that transmits the visible light and attenuates second infrared light among the infrared light, and a third infrared light filter that transmits the visible light and attenuates third infrared light among the infrared light, the light reception unit includes a first photoelectric conversion unit, a second photoelectric conversion unit, and a third photoelectric conversion unit, the first photoelectric conversion unit performs photoelectric conversion of light transmitted through the first on-chip lens, the first color filter, and the first infrared light filter, the second photoelectric conversion unit performs photoelectric conversion of light transmitted through the second on-chip lens, the second color filter, and the second infrared light filter, and the third photoelectric conversion unit performs photoelectric conversion of light transmitted through the third on-chip lens, the third color filter, and the third infrared light filter. Thus, an effect that the photoelectric conversion unit performs the photoelectric conversion of the incident light transmitted through the color filter and the infrared light filter is obtained.

Advantageous Effects of Invention

According to an embodiment of the present technology, it is possible to achieve an excellent effect of simplifying a configuration of the imaging apparatus that generates a color image from an image obtained by imaging the infrared light from the subject.

BRIEF DESCRIPTION OF DRAWINGS

FIG. 1 is a diagram illustrating a configuration example of an imaging element according to a first embodiment of the present technology.

FIG. 2 is a diagram illustrating a configuration example of a pixel according to the first embodiment of the present technology.

FIG. 3A is a diagram illustrating a disposition example of a color filter and an infrared light filter according to the first embodiment of the present technology.

FIG. 3B is a diagram illustrating a disposition example of a color filter and an infrared light filter according to the first embodiment of the present technology.

FIG. 4 is a diagram illustrating an example of spectral characteristics of the color filter according to the first embodiment of the present technology.

FIG. 5 is a diagram illustrating an example of spectral characteristics of the infrared light filter according to the first embodiment of the present technology.

FIG. 6A is a diagram illustrating an example of spectral characteristics of the color filter and the infrared light filter according to the first embodiment of the present technology.

FIG. 6B is a diagram illustrating an example of spectral characteristics of the color filter and the infrared light filter according to the first embodiment of the present technology.

FIG. 6C is a diagram illustrating an example of spectral characteristics of the color filter and the infrared light filter according to the first embodiment of the present technology.

FIG. 7 is a diagram illustrating an example of spectral characteristics in the pixel according to the first embodiment of the present technology.

FIG. 8 is a diagram illustrating an example of generation of an image signal according to the infrared light according to the first embodiment of the present technology.

FIG. 9 is a diagram illustrating an example of the infrared light filter according to an embodiment of the present technology.

FIG. 10 is a diagram illustrating a disposition example of the color filter and the infrared light filter according to a second embodiment of the present technology.

FIG. 11 is a diagram illustrating an example of a combination of the color filter and the infrared light filter according to the second embodiment of the present technology.

FIG. 12A is a diagram illustrating an example of the spectral characteristics of the color filter and the infrared light filter according to the second embodiment of the present technology.

FIG. 12B is a diagram illustrating an example of the spectral characteristics of the color filter and the infrared light filter according to the second embodiment of the present technology.

FIG. 12C is a diagram illustrating an example of the spectral characteristics of the color filter and the infrared light filter according to the second embodiment of the present technology.

FIG. 13A is a diagram illustrating an example of the spectral characteristics of the color filter and the infrared light filter according to the second embodiment of the present technology.

FIG. 13B is a diagram illustrating an example of the spectral characteristics of the color filter and the infrared light filter according to the second embodiment of the present technology.

FIG. 13C is a diagram illustrating an example of the spectral characteristics of the color filter and the infrared light filter according to the second embodiment of the present technology.

FIG. 14A is a diagram illustrating an example of the spectral characteristics of the color filter and the infrared light filter according to the second embodiment of the present technology.

FIG. 14B is a diagram illustrating an example of the spectral characteristics of the color filter and the infrared light filter according to the second embodiment of the present technology.

FIG. 14C is a diagram illustrating an example of the spectral characteristics of the color filter and the infrared light filter according to the second embodiment of the present technology.

FIG. 15A is a diagram illustrating an example of the spectral characteristics of the color filter and the infrared light filter according to the second embodiment of the present technology.

FIG. 15B is a diagram illustrating an example of the spectral characteristics of the color filter and the infrared light filter according to the second embodiment of the present technology.

FIG. 15C is a diagram illustrating an example of the spectral characteristics of the color filter and the infrared light filter according to the second embodiment of the present technology.

FIG. 16A is a diagram illustrating an example of the spectral characteristics of the color filter and the infrared light filter according to the second embodiment of the present technology.

FIG. 16B is a diagram illustrating an example of the spectral characteristics of the color filter and the infrared light filter according to the second embodiment of the present technology.

FIG. 16C is a diagram illustrating an example of the spectral characteristics of the color filter and the infrared light filter according to the second embodiment of the present technology.

FIG. 17A is a diagram illustrating an example of the spectral characteristics of the color filter and the infrared light filter according to the second embodiment of the present technology.

FIG. 17B is a diagram illustrating an example of the spectral characteristics of the color filter and the infrared light filter according to the second embodiment of the present technology.

FIG. 17C is a diagram illustrating an example of the spectral characteristics of the color filter and the infrared light filter according to the second embodiment of the present technology.

FIG. 18A is a diagram illustrating an example of generation of the image signal according to the infrared light according to the second embodiment of the present technology.

FIG. 18B is a diagram illustrating an example of generation of the image signal according to the infrared light according to the second embodiment of the present technology.

FIG. 18C is a diagram illustrating an example of generation of the image signal according to the infrared light according to the second embodiment of the present technology.

FIG. 19A is diagram illustrating an example of a method of manufacturing the infrared light filter according to the second embodiment of the present technology.

FIG. 19B is diagram illustrating an example of a method of manufacturing the infrared light filter according to the second embodiment of the present technology.

FIG. 19C is diagram illustrating an example of a method of manufacturing the infrared light filter according to the second embodiment of the present technology.

FIG. 19D is diagram illustrating an example of a method of manufacturing the infrared light filter according to the second embodiment of the present technology.

FIG. 19E is diagram illustrating an example of a method of manufacturing the infrared light filter according to the second embodiment of the present technology.

FIG. 19F is diagram illustrating an example of a method of manufacturing the infrared light filter according to the second embodiment of the present technology.

FIG. 20A is diagram illustrating another example of the method of manufacturing the infrared light filter according to the second embodiment of the present technology.

FIG. 20B is diagram illustrating another example of the method of manufacturing the infrared light filter according to the second embodiment of the present technology.

FIG. 20C is diagram illustrating another example of the method of manufacturing the infrared light filter according to the second embodiment of the present technology.

FIG. 20D is diagram illustrating another example of the method of manufacturing the infrared light filter according to the second embodiment of the present technology.

FIG. 20E is diagram illustrating another example of the method of manufacturing the infrared light filter according to the second embodiment of the present technology.

FIG. 21A is diagram illustrating a continuation of the method of manufacturing the infrared light filter according to the second embodiment of the present technology, as illustrated in FIGS. 20A-20E.

FIG. 21B is diagram illustrating a continuation of the method of manufacturing the infrared light filter according to the second embodiment of the present technology, as illustrated in FIGS. 20A-20E.

FIG. 22 is a diagram illustrating a disposition example of the color filter and the infrared light filter according to a third embodiment of the present technology.

FIG. 23 is a diagram illustrating an example of the spectral characteristics of the color filter and the infrared light filter according to the third embodiment of the present technology.

FIG. 24 is a diagram illustrating an example of generation of the image signal according to the infrared light according to the third embodiment of the present technology.

FIG. 25 is a diagram illustrating a disposition example of the color filter and the infrared light filter according to a fourth embodiment of the present technology.

FIG. 26 is a diagram illustrating a configuration example of a pixel according to a fifth embodiment of the present technology.

FIG. 27 is a diagram illustrating a configuration example of the pixel according to a sixth embodiment of the present technology.

FIG. 28A is diagram illustrating an example of the method of manufacturing the infrared light filter according to the sixth embodiment of the present technology.

FIG. 28B is diagram illustrating an example of the method of manufacturing the infrared light filter according to the sixth embodiment of the present technology.

FIG. 28C is diagram illustrating an example of the method of manufacturing the infrared light filter according to the sixth embodiment of the present technology.

FIG. 28D is diagram illustrating an example of the method of manufacturing the infrared light filter according to the sixth embodiment of the present technology.

FIG. 28E is diagram illustrating an example of the method of manufacturing the infrared light filter according to the sixth embodiment of the present technology.

FIG. 28F is diagram illustrating an example of the method of manufacturing the infrared light filter according to the sixth embodiment of the present technology.

FIG. 29 is a diagram illustrating a configuration example of the pixel according to a seventh embodiment of the present technology.

FIG. 30A is a diagram illustrating a disposition example of the pixels according to the seventh embodiment of the present technology.

FIG. 30B is a diagram illustrating a disposition example of the pixels according to the seventh embodiment of the present technology.

FIG. 30C is a diagram illustrating a disposition example of the pixels according to the seventh embodiment of the present technology.

FIG. 30D is a diagram illustrating a disposition example of the pixels according to the seventh embodiment of the present technology.

FIG. 31A is a diagram illustrating a configuration example of an imaging element according to an eighth embodiment of the present technology.

FIG. 31B is a diagram illustrating a configuration example of an imaging element according to an eighth embodiment of the present technology.

FIG. 32A is a diagram illustrating another example of the configuration of the imaging element according to the eighth embodiment of the present technology.

FIG. 32B is a diagram illustrating another example of the configuration of the imaging element according to the eighth embodiment of the present technology.

FIG. 32C is a diagram illustrating another example of the configuration of the imaging element according to the eighth embodiment of the present technology.

FIG. 33 is a block diagram illustrating a schematic configuration example of a camera that is an example of an imaging apparatus to which the present technology is able to be applied.

FIG. 34 is a block diagram depicting an example of schematic configuration of a vehicle control system.

FIG. 35 is a diagram of assistance in explaining an example of installation positions of an outside-vehicle information detecting section and an imaging section.

DESCRIPTION OF EMBODIMENTS

Next, a mode for implementing the present technology (hereinafter referred to as an embodiment) will be described with reference to the drawings. In the following drawings, the same or similar reference signs are attached to the same or similar portions. However, the drawings are schematic, and ratios of dimensions of each unit and the like do not necessarily match the actual ones. In addition, of course, the drawings also include portions having different dimensional relationships and ratios. In addition, the description of the embodiments will be given in the following sequence.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Application example to camera system
10. Application example to mobile object 1. First Embodiment Configuration of Imaging Element FIG. 1 is a diagram illustrating a configuration example of an imaging element 1 according to the first embodiment of the present technology. The imaging element 1 in the same figure includes a pixel array unit 10, a vertical driving unit 20, a column signal processing unit 30, and a control unit 40.

The pixel array unit 10 is configured by disposing pixels 100 in a two-dimensional grid pattern. Here, each pixel 100 generates an image signal according to irradiated light. The pixel 100 has a photoelectric conversion unit that generates an electric charge according to the irradiated light. In addition, the pixel 100 further includes a pixel circuit. The pixel circuit generates an image signal based on the electric charge generated by the photoelectric conversion unit. The generation of the image signal is controlled by a control signal generated by the vertical driving unit 20 that will be described later. In the pixel array unit 10, signal lines 11 and 12 are disposed in an XY matrix pattern. The signal line 11 is a signal line that transfers the control signal of the pixel circuit in the pixel 100. The signal line 11 is disposed for each row of the pixel array unit 10, and is wired in common to the pixels 100 disposed in each row. The signal line 12 is a signal line that transfers the image signal generated by the pixel circuit of the pixel 100. The signal line 12 is disposed for each column of the pixel array unit 10 and is wired in common to the pixels 100 disposed in each column. The photoelectric conversion unit and the pixel circuit are formed on a semiconductor substrate.

The vertical driving unit 20 generates the control signal of the pixel circuit of the pixel 100. The vertical driving unit 20 transfers the generated control signal to the pixel 100 through the signal line 11 in the same figure. The column signal processing unit 30 processes the image signal generated by the pixel 100. The column signal processing unit 30 performs a process of the image signal transferred from the pixel 100 through the signal line 12 in the same figure. The process in the column signal processing unit 30 corresponds to, for example, analog-to-digital conversion for converting an analog image signal generated in the pixel 100 into a digital image signal. The image signal processed by the column signal processing unit 30 is output as the image signal of the imaging element 1. The control unit 40 controls the entire imaging element 1. The control unit 40 controls the imaging element 1 by generating and outputting the control signal for controlling the vertical driving unit 20 and the column signal processing unit 30. The control signals generated by the control unit 40 are transmitted to the vertical driving unit 20 and the column signal processing unit 30 through signal lines 41 and 42, respectively.

Configuration of Pixel

FIG. 2 is a diagram illustrating a configuration example of the pixel according to the first embodiment of the present technology. The same figure is a schematic cross-sectional view illustrating a configuration of the pixel 100 disposed in the pixel array unit 10.

The pixel 100 includes an on-chip lens 111, a color filter 120, an infrared light filter 130, a planarization film 141, a light shielding film 142, a semiconductor substrate 151, an insulating layer 161, a wiring layer 162, and a support substrate 171.

The semiconductor substrate 151 is a semiconductor substrate on which a semiconductor portion of the photoelectric conversion unit or the pixel circuit of the pixel 100 described with reference to FIG. 1 is formed. In addition, semiconductor portions of the vertical driving unit 20, the column signal processing unit 30, and the control unit 40 are further formed on the semiconductor substrate 151. In the same figure, among them, the photoelectric conversion unit 154 of the pixel 100 is described. For the sake of convenience, it is assumed that the semiconductor substrate 151 in the same figure is configured in a p-type well region. The photoelectric conversion unit 154 includes an n-type semiconductor region 153 and a p-type well region around the n-type semiconductor region 153. Photoelectric conversion according to incident light is performed in a pn junction formed at an interface between the n-type semiconductor region 153 and the p-type well region, and an electric charge generated by the photoelectric conversion is held in the n-type semiconductor region 153. The image signal is generated by the pixel circuit (not shown) on the basis of the electric charge generated by the photoelectric conversion of the photoelectric conversion unit 154.

Note that a pixel separation portion 152 is disposed between the pixels 100 on the semiconductor substrate 151. The pixel separation portion 152 is a region for preventing movement of electric charges between the pixels 100. In addition, an insulating film 155 is disposed on a surface of the semiconductor substrate 151. In addition to the photoelectric conversion unit 154 and the pixel circuit, the vertical driving unit 20, the column signal processing unit 30, and the control unit 40 (none of which is shown) are formed on the semiconductor substrate 151. Note that the semiconductor substrate 151 is an example of a light reception unit described in the claims.

The wiring layer 162 is a wiring for transferring the image signal generated in the pixel 100 or a control signal for controlling the pixel circuit. The wiring layer 162 configures the signal lines 11 and 12 described with reference to FIG. 1. In addition, the wiring layers 162 are insulated from each other by the insulating layer 161. Note that the imaging element 1 including the pixel 100 in the same figure is an imaging element of a rear surface irradiation type in which the wiring layer 162 is disposed on a surface different from a surface through which light enters the semiconductor substrate 151.

The on-chip lens 111 is a lens that condenses incident light on the photoelectric conversion unit 154. The on-chip lens 111 allows the incident light to enter the photoelectric conversion unit 154 through the color filter 120 and the infrared light filter 130. The on-chip lens 111 is disposed for each pixel 100. A plurality of on-chip lenses 111 configure an on-chip lens unit 110.

The color filter 120 is an optical filter that transmits visible light of a predetermined wavelength among visible light. Here, light having a wavelength of, for example, 380 nm to 750 nm corresponds to visible light. As the color filter 120, for example, three kinds of color filters that transmit red light (wavelength 700 nm), green light (wavelength 546 nm), and blue light (436 nm) are able to be used. The color filters 120 transmit only the visible light of the corresponding wavelength. For example, the color filter 120 corresponding to the red light attenuates the green light, the blue light, or the like that is the visible light other than the red light. As described above, the color filter 120 performs band pass type filtering in a visible light region. On the other hand, the color filter 120 transmits the infrared light. Here, light having a wavelength of, for example, 750 nm to 1200 nm corresponds to infrared light.

The infrared light filter 130 is an optical filter that attenuates infrared light of a predetermined wavelength among the infrared light. As the infrared light filter 130, for example, three kinds of infrared light filters 130 that attenuate infrared light having wavelengths of 750 nm, 850 nm, and 940 nm are able to be used. The infrared light filters 130 attenuate and remove the infrared light of the corresponding wavelength. That is, the infrared light filter 130 transmits infrared light having a wavelength other than the corresponding wavelength among the infrared light. Note that, in a case in which a subject to be imaged by the imaging element 1 is irradiated with the infrared light from an LED light source or the like, the infrared light filter 130 that attenuates infrared light having the same wavelength as the irradiated infrared light is able to be used. An image signal based on infrared light having two wavelengths among three wavelengths is able to be generated by disposing the LED light source and the infrared light filter 130 for each of the three wavelengths to perform imaging. As described above, the infrared light filter 130 performs band removal filtering in an infrared light region. On the other hand, the infrared light filter 130 transmits the visible light.

The visible light having a predetermined wavelength is able to be transmitted and the infrared light of a predetermined wavelength is able to be attenuated with respect to the light entering the pixel 100 by accumulating and disposing the color filter 120 and the infrared light filter 130 in the pixel 100. In addition, it is possible to generate an image signal according to visible light of a predetermined wavelength and infrared light of a wavelength excluding a predetermined wavelength. Details of configurations of the color filter 120 and the infrared light filter 130 will be described later.

The light shielding film 142 is disposed at a boundary of the pixels 100 on the surface of the semiconductor substrate 151 and is a film that shields light transmitted through the color filter 120 of the adjacent pixel 100. The planarization film 141 is a film for planarization of the surface of the semiconductor substrate 151 when the color filter 120 and the infrared light filter 130 are formed. The planarization film 141 is disposed between the insulating film 155 and the light shielding film 142, and the color filter 120 and the infrared light filter 130.

Configuration of Imaging Element

FIGS. 3A-3B are diagrams illustrating disposition examples of the color filter and the infrared light filter according to the first embodiment of the present technology. The same figures are diagrams showing a disposition of the color filter and the infrared light filter in the plurality of pixels 100 of the imaging element 1. In addition, the same figures show the disposition of the color filters 120 that transmit the red light, the green light, and the blue light, respectively, and the infrared light filters 130 that attenuate infrared light having wavelengths of 750 nm, 850 nm, and 940 nm, respectively. In the same figures, "R" denotes a color filter 120 that transmits the red light, "G" denotes a color filter 120 that transmits the green light, and "B" denotes a color filter 120 that transmits the blue light. The image signal according to each color filter 120 is generated by the pixel 100 by the disposition of the color filter 120 in the pixel 100 as described above.

That is, the pixel 100 in which the color filter 120 that transmits the red light is disposed generates an image signal according to the red light, and the pixel 100 in which the color filter 120 that transmits the green light is disposed generates an image signal according to the green light. In addition, the pixel 100 in which the color filter 120 that transmits the blue light is disposed generates an image signal according to the blue light. Hereinafter, the color filters 120 corresponding to red, green, and blue are referred to as a red light color filter 120, a green light color filter 120, and a blue light color filter 120, respectively. In addition, hereinafter, the pixels 100 in which the red light color filter 120, the green light color filter 120, and the blue light color filter 120 are disposed are referred to as a red pixel 100, a green pixel 100, and a blue pixel 100, respectively.

In addition, in the same figures, "SIR 750" denotes an infrared light filter 130 that attenuates infrared light having a wavelength of 750 nm, and "SIR 850" denotes an infrared light filter 130 that attenuates infrared light having a wavelength of 850 nm. "SIR 940" denotes an infrared light filter 130 that attenuates infrared light having a wavelength of 940 nm. Hereinafter, the infrared light filters 130 that attenuate the infrared light having the wavelengths of 750 nm, 850 nm, and 940 nm are referred to as a 750 infrared light filter 130, an 850 infrared light filter 130, and a 940 infrared light filter 130, respectively. In addition, FIG. 3A shows an example in which the infrared light filter 130 is disposed in a lower layer of the color filter 120, and FIG. 3B shows an example in which the infrared light filter 130 is disposed in an upper layer of the color filter 120.

Note that the red light color filter 120, the green light color filter 120, and the blue light color filter 120 are examples of a first color filter, a second color filter, and a third color filter described in the claims. The red pixel 100, the green pixel 100, and the blue pixel 100 are examples of a first pixel, a second pixel, and a third pixel described in the claims. The color filter 120 is an example of a first filter layer described in the claims. The 750 infrared light filter 130, the 850 infrared light filter 130, and the 940 infrared light filter 130 are examples of a first infrared light filter, a second infrared light filter, and a third infrared light filter described in the claims. The infrared light filter 130 is an example of a second filter layer described in the claims.

As described above, on the semiconductor substrate 151, the photoelectric conversion unit 154 is disposed for each pixel 100 and the photoelectric conversion is performed. Therefore, the semiconductor substrate 151 is able to be regarded as the light reception unit that receives the light from the subject. In this case, it is also possible to interpret that the first filter layer and the second filter layer described above are disposed between the on-chip lens unit 110 and the light reception unit. Here, each photoelectric conversion unit 154 disposed in the three pixels (the red pixel 100, the green pixel 100, and the blue pixel 100) is referred to as a first photoelectric conversion unit, a second photoelectric conversion unit, and a third photoelectric conversion unit. In addition, each on-chip lens 111 disposed in the three pixels (the red pixel 100, the green pixel 100, and the blue pixel 100) is referred to as a first on-chip lens, a second on-chip lens, and a third on-chip lens. Then, in the examples of the same figures, the red light color filter 120 and the 940 infrared light filter 130 are disposed between the first on-chip lens and the first photoelectric conversion unit. Similarly, the green light color filter 120 and the 750 infrared light filter 130 are disposed between the second on-chip lens and the second photoelectric conversion unit. The blue light color filter 120 and the 850 infrared light filter 130 are disposed between the third on-chip lens and the third photoelectric conversion unit.

In addition, it is also possible to interpret that the light reception unit performs photoelectric conversion of light transmitted through the on-chip lens unit 110, the first filter layer, and the second filter layer. In this case, the first photoelectric conversion unit performs photoelectric conversion of light transmitted through the first on-chip lens, the red light color filter 120, and the 940 infrared light filter 130. The second photoelectric conversion unit performs photoelectric conversion of light transmitted through the second on-chip lens, the green light color filter 120, and the 750 infrared light filter 130. The third photoelectric conversion unit performs photoelectric conversion of light transmitted through the third on-chip lens, the blue light color filter 120, and the 850 infrared light filter 130. Note that, of course, in such an interpretation, a combination of the color filter 120 and the infrared light filter 130 in the pixel 100 is not limited to the above-described example.

The color filter 120 is able to be configured on the basis of a predetermined arrangement. For example, the color filter 120 is able to be arranged on the basis of the Bayer arrangement. Here, the Bayer arrangement is an arrangement in which the red pixel 100 and the blue pixel 100 are disposed between the green pixels 100 disposed in a checkered pattern. The infrared light filter 130 is disposed such that each of the infrared light to be attenuated is paired with each of corresponding visible light of the color filter 120. Specifically, as shown in the same figures, the red light color filter 120 and the 940 infrared light filter 130 are disposed in the same pixel 100. In addition, the green light color filter 120 and the 750 infrared light filter 130 are disposed in the same pixel 100. In addition, similarly, the blue light color filter 120 and the 850 infrared light filter 130 are disposed in the same pixel 100.

Spectral Characteristics of Color Filter

FIG. 4 is a diagram illustrating an example of the spectral characteristics of the color filter according to the first embodiment of the present technology. The same figure is a diagram showing a transmittance of light in the visible light and infrared light regions of the color filter 120. In the figure, a horizontal axis denotes a wavelength of light (unit: nm), and a vertical axis denotes a relative transmittance. Graphs 301, 302, and 303 of the same figure are graphs showing the transmittances of the blue light color filter 120, the green light color filter 120, and the red light color filter 120, respectively. As shown in the same figure, the color filters 120 have high transmittances of corresponding wavelengths in the visible light region and transmit the visible light.

On the other hand, in the infrared light region, infrared light having a relatively wide range of wavelength is transmitted. Note that the red light color filter 120 shows a high transmittance for substantially all infrared light. On the other hand, the blue light color filter 120 shows high transmittance with respect to the infrared light having a wavelength longer than 800 nm and a low transmittance with respect to the infrared light having the wavelength of 750 nm. The green light color filter 120 shows intermediate characteristics between the red light color filter 120 and the blue light color filter 120, and the relative transmittance becomes 0.5 even in the infrared light having the wavelength of 750 nm.

Note that the configuration of the color filter 120 is not limited to this example. For example, instead of the red light color filter 120, the green light color filter 120, and the blue light color filter 120, complementary color filters that transmit cyan, magenta and yellow visible light respectively may be used as the color filters 120.

Spectral Characteristics of Infrared Light Filter

FIG. 5 is a diagram illustrating an example of the spectral characteristics of the infrared light filter according to the first embodiment of the present technology. The same figure is a diagram showing a transmittance of light in the visible light and infrared light regions of the infrared light filter 130. Graphs 304, 305, and 306 of the same figure are graphs showing the transmittances of the 750 infrared light filter 130, the 850 infrared light filter 130, and the 940 infrared light filter 130, respectively. In addition, three broken lines in the same figure denote wavelengths of 750 nm, 850 nm, and 940 nm, respectively. As shown in the same figure, the infrared light filters 130 have low transmittances of corresponding wavelengths in the infrared light region and attenuate the infrared light. For infrared light and visible light other than the corresponding infrared light, the transmittance of the infrared light filter 130 is increased. The wavelengths of the three infrared light attenuated by the infrared light filter 130 are able to be changed according to the spectral characteristics of the infrared light filter and are able to be set to values different by at least 30 nm.

Note that the configuration of the infrared light filter 130 is not limited to this example. For example, the wavelength of the infrared light to be attenuated is able to be changed according to the infrared light to be imaged.

Spectral Characteristics of Case in which Color Filter and Infrared Light Filter are Stacked FIGS. 6A-6C are diagrams illustrating examples of the spectral characteristics of the color filter and the infrared light filter according to the first embodiment of the present technology. The same figures are diagrams showing spectral characteristics of a filter formed by stacking the color filter 120 and the infrared light filter 130. The spectral characteristics of the color filter 120 and the infrared light filter 130 are able to be superimposed by stacking the color filter 120 and the infrared light filter 130.

FIG. 6A is a diagram showing spectral characteristics of a case in which the red light color filter 120 and the infrared light filter 130 are stacked. Graphs 311, 312, and 313 of FIG. 6A in the same figure are graphs showing spectral characteristics of cases in which the 750 infrared light filter 130, the 850 infrared light filter 130, and the 940 infrared light filter 130 are stacked, respectively.

FIG. 6B is a diagram showing spectral characteristics of a case in which the green light color filter 120 and the infrared light filter 130 are stacked. Graphs 321, 322, and 323 of FIG. 6B in the same figure are graphs showing spectral characteristics of cases in which the 750 infrared light filter 130, the 850 infrared light filter 130, and the 940 infrared light filter 130 are stacked, respectively.

FIG. 6C is a diagram showing spectral characteristics of a case in which the blue light color filter 120 and the infrared light filter 130 are stacked. Graphs 331, 332, and 333 of FIG. 6C in the same figure are graphs showing spectral characteristics of cases in which the 750 infrared light filter 130, the 850 infrared light filter 130, and the 940 infrared light filter 130 are stacked, respectively. As described with reference to FIG. 4, since the transmittance of the infrared light having the wavelength of 750 nm is low in the blue light color filter 120, the graphs 331, 332, and 333 have low transmittance with respect to the infrared light having the wavelength of 750 nm. In any of the cases of FIGS. 6A-6C, it is possible to obtain spectral characteristics for attenuating infrared light of a predetermined wavelength in the infrared light region while transmitting visible light of a predetermined wavelength in the visible light region.

FIG. 7 is a diagram illustrating an example of spectral characteristics in the pixel according to the first embodiment of the present technology. The same figure shows the spectral characteristics of the case in which the color filter 120 and the infrared light filter 130 are stacked described with reference to FIGS. 6A-6C in one figure for the color filter 120 corresponding to the red light, the green light, and the blue light. The same reference signs as the graphs described with reference to FIGS. 6A-6C are applied to the graph of the same figure.

As shown in the same figure, it is possible to add spectral characteristics to different infrared light regions for each of the red pixel 100, the green pixel 100, and the blue pixel 100 by disposing the infrared light filter 130 that attenuates infrared light of a predetermined wavelength in a pixel. Specifically, when the infrared light region is divided into three regions having center wavelengths of 750 nm, 850 nm, and 940 nm, respectively, the graph 313 shows spectral characteristics in which the red light and the infrared light in the region of 750 nm and 850 nm are transmitted. The pixel 100 in which the color filter 120 and the infrared light filter 130 having such characteristics are disposed generates an image signal according to the red light and the infrared light in the region of 750 nm and 850 nm. In addition, the photoelectric conversion unit 154 of the pixel 100 is able to receive infrared light having a wavelength from 700 nm to 850 nm.

Similarly, the graph 321 shows spectral characteristics in which the green light and the infrared light in the region of 850 nm and 940 nm are transmitted. The pixel 100 in which the color filter 120 and the infrared light filter 130 having the spectral characteristics in the graph 321 are disposed generates an image signal according to the green light and the infrared light in the region of 850 nm and 940 nm. In addition, the photoelectric conversion unit 154 of the pixel 100 is able to receive infrared light having a wavelength longer than 850 nm in addition to green light having a wavelength of 546 nm.

The graph 332 shows spectral characteristics in which the blue light and the infrared light in the region of 940 nm are transmitted. The pixel 100 in which the color filter 120 and the infrared light filter 130 having the spectral characteristics of the graph 332 are disposed generates an image signal according to the blue light and the infrared light in the region of 940 nm. In addition, the photoelectric conversion unit 154 of the pixel 100 is able to receive infrared light having a wavelength longer than 940 nm in addition to blue light having a wavelength of 436 nm. As described above, an image signal according to light of at least one of wavelengths of approximately 750 nm, 850 nm, and 940 nm is generated in the pixel 100.

It is possible to generate an image signal according to the infrared light in the region of 750 nm, 850 nm, and 940 nm from the image signal generated in the pixels 100. For example, it is possible to generate the image signal according to the infrared light in the region of 750 nm, 850 nm, and 940 nm by generating a difference image signal of the image signals generated by the pixels 100.

Generation of Image Signal According to Infrared Light

FIG. 8 is a diagram illustrating an example of generation of the image signal according to the infrared light according to the first embodiment of the present technology. The same figure is a diagram showing the image signal according to the infrared light (hereinafter referred to as an infrared light image signal) generated by calculating a difference between image signals generated in the pixel 100 having the color filter 120 and the infrared light filter 130 described with reference to FIG. 7. In the same figure, a horizontal axis denotes a wavelength of incident light of the pixel 100, and a vertical axis denotes a relative image signal level.

A graph 342 of the same figure is a graph showing an image signal based on a difference between image signals generated by respective pixels 100 including the color filters 120 and the infrared light filters 130 having the characteristics of the graphs 321 and 332 in FIG. 7. That is, the graph 342 is a graph showing an image signal obtained by subtracting the image signal of the blue pixel 100 in which the 850 infrared light filter 130 is disposed from the image signal of the green pixel 100 in which the 750 infrared light filter 130 is disposed. In the graph 342, the image signal level at the wavelength of 850 nm is high and the image signal level at the wavelengths of 750 nm and 940 nm is low. Therefore, it possible to generate the image signal according to the infrared light having the wavelength of 850 nm by the image signal of the green pixel 100 in which the 750 infrared light filter 130 is disposed and the blue pixel 100 in which the 850 infrared light filter 130 is disposed.

In addition, a graph 343 in the same figure is a graph showing an image signal generated by the pixel 100 including the color filter 120 and the infrared light filter 130 having the characteristics of the graph 332 in FIG. 7. That is, the graph 343 is a graph showing the image signal generated by the blue pixel 100 in which the 850 infrared light filter 130 is disposed. In the graph 343, the image signal level at the wavelength of 940 nm is high and the image signal level at the wavelengths of 750 nm and 850 nm is low. Therefore, it is possible to generate the image signal according to the infrared light having the wavelength of 940 nm by the image signal of the blue pixel 100 in which the 850 infrared light filter 130 is disposed. As described above, since the transmittance of the blue light color filter 120 at a wavelength of 750 nm is low, it is possible to generate the image signal according to the infrared light having the wavelength of 940 nm by disposing the 850 infrared light filter 130 in the blue pixel 100.

In addition, a graph 341 in the same figure is a graph showing an image signal based on a difference between the image signal generated by the pixel 100 including the color filter 120 and the infrared light filter 130 having the characteristics of the graph 313 in FIG. 7 and the image signal corresponding to the graph 342 described above. That is, the graph 341 is a graph showing an image signal obtained by subtracting the image signal corresponding to the graph 342 from the image signal of the red pixel 100 in which the 940 infrared light filter 130 is disposed. In the graph 341, the image signal level at the wavelength of 750 nm is high and the image signal level at the wavelengths of 850 nm and 940 nm is low. It is possible to generate the image signal according to the infrared light of the wavelength of 750 nm by the image signals of the red pixel 100 in which the 940 infrared light filter 130 is disposed, the green pixel 100 in which the 750 infrared light filter 130 is disposed 850, and the blue pixel 100 in which the 850 infrared light filter 130 is disposed.

It is possible to generate the image signals according to the infrared light from the subject as the image signals of the red pixel 100, the green pixel 100, and the blue pixel 100, by disposing the infrared light filter 130 in the pixel 100 as described above. Thus, it is possible to convert an image signal of the infrared light into an image signal of the visible light.

Note that, a calculation result in the visible light region has a negative value by performing the subtraction described above. However, since imaging of the infrared light is performed in a low illumination environment such as nighttime, an influence on a detection of the infrared light is low even if the calculation result is a negative calculation result in the visible light region. In addition, when imaging of the infrared light is performed, it is possible to remove an influence of the visible light by disposing a filter that shields the visible light in the optical path between the imaging element 1 and the subject. In addition, when the imaging element 1 is used in imaging the visible light, it is possible to remove an influence of the infrared light by disposing a filter that shields the infrared light in the above-described optical path.

Note that the generation of the infrared light image signal is not limited to this example. For example, it is also possible to use a method of converting respective image signals generated by the red pixel 100, the green pixel 100, and the blue pixel 100 into the infrared image signal using a table that is generated in advance.

The calculation of the image signal generated by the above-described red pixel 100 or the like is able to be performed inside the imaging element 1, for example, by the column signal processing unit 30. In addition, the imaging element 1 is also able to perform output of the image signal generated by the pixel 100 and the calculation of the image signal is also able to be performed by a processing circuit outside the imaging element 1. It is also possible to switch such setting as to whether or not to calculate the image signal with respect to the imaging element 1 by a processing circuit or the like outside the imaging element 1.

When setting in which the calculation of the above-described image signal is not performed in the imaging element 1 and the processing circuit outside the imaging element 1, monochrome display is performed. The processing circuit described above is also able to perform monochrome display by a corresponding color by selecting a color of an image signal having, for example, the highest signal level among the image signals of the red pixel 100, the green pixel 100, and the blue pixel 100. In addition, it is also possible to display a color matching the wavelength of the light source emitted on the subject.

Such a processing circuit is able to be configured, for example, in a semiconductor chip different from a semiconductor chip configuring the imaging element 1. The semiconductor chip of the processing circuit and the semiconductor chip configuring the imaging element 1 are able to be stacked in one package to configure the imaging apparatus. A complementary metal oxide semiconductor (CMOS) type imaging element such as the imaging element 1 is able to stack semiconductor chips of a processing circuit differently from a charge coupled device (CCD) type imaging element. It is possible to stack semiconductor chips including a processing circuit according to a use of the imaging element 1 and to simplify the configuration of an apparatus on which the imaging element is mounted.

In addition, when the above-described complementary color filter is adopted as the color filter 120, operation of converting an image signal of a complementary color into an image signal of a primary color is also able to be performed by the column signal processing unit 30 or the processing circuit disposed outside the imaging element 1 described above. Note that the column signal processing unit 30 is an example of a processing circuit described in the claims.

As described above, the imaging element 1 divides the infrared light reflected from the subject into three bands by using a fact that reflectance of the infrared light of the subject varies for each band of the infrared light, and allocates red, green, and blue to the three bands, performs conversion into the image signals, and outputs the image signals. It is possible to obtain a full color image by performing display on the basis of the output image signal. It is possible to color an image of a monochrome subject by the infrared light.

In addition, it is also possible to divide the infrared light for each band by combining three dichroic plate filters or dichroic prism filters. However, in a case in which such plurality of optical components are used, there is a problem that the imaging apparatus becomes complicated. On the other hand, since the imaging element 1 divides the infrared light reflected from the subject into the three bands by the stacked color filter 120 and the infrared light filter 130, it is possible to simplify the configuration of the imaging apparatus.

Configuration of Infrared Light Filter

FIG. 9 is a diagram illustrating an example of the infrared light filter according to an embodiment of the present technology. The same figure is a chemical formula representing a structure of a material of the infrared light filter 130. In the infrared light filter 130, a resin including a pigment having near infrared light absorptivity is able to be used. For example, the pigment having near infrared light absorptivity corresponds to a pyrrolopyrrole pigment, a copper compound, a cyanine type pigment, a phthalocyanine type pigment, an imonium type pigment, a thiol complex type pigment, a transition metal oxide based compound, and a squarylium type pigment. In addition, a naphthalocyanine type pigment, a quaterrylene type pigment, a dithiol metal complex type pigment, and a croconium compounds are also able to be used. The same figure is a chemical formula representing a structure of the pyrrolopyrrole pigment. In the formula, each of R1a and R1b independently denotes an alkyl group, an aryl group, or a heteroaryl group. Each of R2 and R3 independently denotes a hydrogen atom or a substituent, and at least one of R2 or R3 is an electron withdrawing group. In addition, R2 and R3 may be bonded to each other to form a ring. R4 denotes a hydrogen atom, an alkyl group, an aryl group, a heteroaryl group, a substituted boron, or a metal atom, and may be covalently combined to or disposed to be combined to at least one of R1a, R1b, or R3.

It is possible to change the wavelength of the infrared light to be absorbed by adjusting the composition of the pigment having such a structure, and it is possible to configure the infrared light filter 130 that attenuates the infrared light of a predetermined wavelength. Note that, in order to form the infrared light filter 130 in the imaging element 1, applying and etching of the above-described resin including the pigment are performed three times to form the 750 infrared light filter 130, the 850 infrared light filter 130, and the 940 infrared light filter 130.

Note that the infrared light filter 130 is able to adopt a single layer structure of the resin including the pigment having the near infrared light absorptivity described above. In addition, in order to obtain the infrared light filter 130 having desired filtering characteristics, it is also possible to adopt a configuration in which a plurality of resin layers having different near infrared light absorptivity are stacked. In addition, the imaging element 1 is also able to be configured as an imaging element of a surface irradiation type in which the wiring layer 162 is disposed on the surface of the semiconductor substrate 151 to which light enters.

As described above, the imaging element 1 according to the first embodiment of the present technology is able to generate the image signal according to the infrared light as the image signal of the visible light by disposing the infrared light filter 130 that attenuates the infrared light of a predetermined wavelength in the pixel 100. Therefore, it possible to simplify the configuration of the apparatus that generates the color image from the image obtained by imaging the infrared light from the subject.

2. Second Embodiment

The imaging element 1 according to the first embodiment described above uses the three infrared light filters 130 of the 750 infrared light filter 130, the 850 infrared light filter 130, and the 940 infrared light filter 130. On the other hand, the imaging element 1 according to the second embodiment of the present technology is different from the first embodiment described above in that two infrared light filters 130 are used.

Configuration of Imaging Element

FIG. 10 is a diagram illustrating a disposition example of the color filter and the infrared light filter according to the second embodiment of the present technology. The infrared light filter 130 in the same figure is different from the infrared light filter 130 described with reference to FIGS. 3A and 3B in that two infrared light filters 130 (the 750 infrared light filter 130 and the 850 infrared light filter 130) are used. The same figure is a diagram showing an example of a case in which the 750 infrared light filter 130 and the 850 infrared light filter 130 are selected among the 750 infrared light filter 130, the 850 infrared light filter 130, and the 940 infrared light filter 130. In addition, the same figure is a diagram showing an example of a case in which the 750 infrared light filter 130 of the selected infrared light filter 130 is stacked on the lower layer of the green light color filter 120, and the 850 infrared light filter 130 of the selected infrared light filter 130 is stacked on the lower layer of the red light color filter 120 and the blue light color filter 120. Even in a case in which the type of the used infrared light filter 130 is reduced as described above, it is possible to generate the image signal according to the infrared light on the basis of the difference of the image signals generated by the pixel 100.

Combination of Color Filter 120 and Infrared Light Filter 130

FIG. 11 is a diagram illustrating an example of the combination of the color filter and the infrared light filter according to the second embodiment of the present technology. The same figure shows a combination that two are selected from the 750 infrared light filter 130, the 850 infrared light filter 130, and the 940 infrared light filter 130, and are allocated to the red light color filter 120, the green light color filter 120, and the blue light color filter 120. Green, red, and blue in the same figure denote the green light color filter 120, the red light color filter 120, and the blue light color filter 120, respectively. In addition, 750, 850 and 940 in the same figure denote the 750 infrared light filter 130, the 850 infrared light filter 130, and the 940 infrared light filter 130, respectively.

Spectral Characteristics of Case in which Color Filter and Infrared Light Filter are Stacked FIGS. 12 to 17 are diagrams illustrating an example of the spectral characteristics of the color filter and the infrared light filter according to the second embodiment of the present technology. FIGS. 12 to 17 are diagrams showing the spectral characteristics of the color filter 120 and the infrared light filter 130 based on the combination described with reference to FIG. 11. The same reference signs as the graph described with reference to FIGS. 6A-6C are applied to graphs of FIGS. 12 to 17. FIG. 12A denotes the spectral characteristics of the green pixel 100 in which the 750 infrared light filter 130 is disposed, the red pixel 100 in which the 750 infrared light filter 130 is disposed, and the blue pixel 100 in which the 850 infrared light filter 130 is disposed. FIG. 12B denotes the spectral characteristics of the green pixel 100 in which the 750 infrared light filter 130 is disposed, the red pixel 100 in which the 750 infrared light filter 130 is disposed, and the blue pixel 100 in which the 940 infrared light filter 130 is disposed. FIG. 12C denotes the spectral characteristics of the green pixel 100 in which the 750 infrared light filter 130 is disposed, the red pixel 100 in which the 850 infrared light filter 130 is disposed, and the blue pixel 100 in which the 750 infrared light filter 130 is disposed.

FIG. 13A denotes the spectral characteristics of the green pixel 100 in which the 750 infrared light filter 130 is disposed, the red pixel 100 in which the 850 infrared light filter 130 is disposed, and the blue pixel 100 in which the 850 infrared light filter 130 is disposed. FIG. 13B denotes the spectral characteristics of the green pixel 100 in which the 750 infrared light filter 130 is disposed, the red pixel 100 in which the 940 infrared light filter 130 is disposed, and the blue pixel 100 in which the 750 infrared light filter 130 is disposed. FIG. 13C denotes the spectral characteristics of the green pixel 100 in which the 750 infrared light filter 130 is disposed, the red pixel 100 in which the 940 infrared light filter 130 is disposed, and the blue pixel 100 in which the 940 infrared light filter 130 is disposed.

FIG. 14A denotes the spectral characteristics of the green pixel 100 in which the 850 infrared light filter 130 is disposed, the red pixel 100 in which the 750 infrared light filter 130 is disposed, and the blue pixel 100 in which the 750 infrared light filter 130 is disposed. FIG. 14B denotes the spectral characteristics of the green pixel 100 in which the 850 infrared light filter 130 is disposed, the red pixel 100 in which the 750 infrared light filter 130 is disposed, and the blue pixel 100 in which the 850 infrared light filter 130 is disposed. FIG. 14C denotes the spectral characteristics of the green pixel 100 in which the 850 infrared light filter 130 is disposed, the red pixel 100 in which the 850 infrared light filter 130 is disposed, and the blue pixel 100 in which the 750 infrared light filter 130 is disposed.

FIG. 15A denotes the spectral characteristics of the green pixel 100 in which the 850 infrared light filter 130 is disposed, the red pixel 100 in which the 850 infrared light filter 130 is disposed, and the blue pixel 100 in which the 940 infrared light filter 130 is disposed. FIG. 15B denotes the spectral characteristics of the green pixel 100 in which the 850 infrared light filter 130 is disposed, the red pixel 100 in which the 940 infrared light filter 130 is disposed, and the blue pixel 100 in which the 850 infrared light filter 130 is disposed. FIG. 15C denotes the spectral characteristics of the green pixel 100 in which the 850 infrared light filter 130 is disposed, the red pixel 100 in which the 940 infrared light filter 130 is disposed, and the blue pixel 100 in which the 940 infrared light filter 130 is disposed.

FIG. 16A denotes the spectral characteristics of the green pixel 100 in which the 940 infrared light filter 130 is disposed, the red pixel 100 in which the 750 infrared light filter 130 is disposed, and the blue pixel 100 in which the 750 infrared light filter 130 is disposed. FIG. 16B denotes the spectral characteristics of the green pixel 100 in which the 940 infrared light filter 130 is disposed, the red pixel 100 in which the 750 infrared light filter 130 is disposed, and the blue pixel 100 in which the 940 infrared light filter 130 is disposed. FIG. 16C denotes the spectral characteristics of the green pixel 100 in which the 940 infrared light filter 130 is disposed, the red pixel 100 in which the 850 infrared light filter 130 is disposed, and the blue pixel 100 in which the 850 infrared light filter 130 is disposed.

FIG. 17A denotes the spectral characteristics of the green pixel 100 in which the 940 infrared light filter 130 is disposed, the red pixel 100 in which the 850 infrared light filter 130 is disposed, and the blue pixel 100 in which the 940 infrared light filter 130 is disposed. FIG. 17B denotes the spectral characteristics of the green pixel 100 in which the 940 infrared light filter 130 is disposed, the red pixel 100 in which the 940 infrared light filter 130 is disposed, and the blue pixel 100 in which the 750 infrared light filter 130 is disposed. FIG. 17C denotes the spectral characteristics of the green pixel 100 in which the 940 infrared light filter 130 is disposed, the red pixel 100 in which the 940 infrared light filter 130 is disposed, and the blue pixel 100 in which the 850 infrared light filter 130 is disposed.

As described above, it is possible to configure the imaging element 1 with respect to the 18 kinds of combinations of the color filters 120 and the infrared light filters 130 shown in FIG. 11.

Generation of Image Signal According to Infrared Light

FIGS. 18A-C are diagrams illustrating examples of generation of the image signal according to the infrared light according to the second embodiment of the present technology. The same figures are diagrams showing the infrared light image signal generated by calculating the difference between the image signals generated by the pixels 100, similarly to FIG. 8. FIG. 18A is a diagram showing the image signal of the imaging element 1 to which the combination of the color filter 120 and the infrared light filter 130 described in FIG. 13A is applied. FIG. 18B is a diagram showing the image signal of the imaging element 1 to which the combination of the color filter 120 and the infrared light filter 130 described in FIG. 13C is applied. FIG. 18C is a diagram showing the image signal of the imaging element 1 to which the combination of the color filter 120 and the infrared light filter 130 described in FIG. 15C is applied.

A graph 344 of FIG. 18A is a graph showing an image signal obtained by subtracting the image signal generated by the blue pixel 100 in which the 850 infrared light filter 130 is disposed from the image signal generated by the red pixel 100 in which the 850 infrared light filter 130 is disposed. Since the graphs 342 and 343 are similar to the graphs described with reference to FIG. 8, the description thereof will be omitted. It is possible to respectively detect the infrared light having the wavelengths of 750 nm, 850 nm, and 940 nm by the image signals corresponding to the graphs 344, 342, and 343.

A graph 345 of FIG. 18B is a graph showing an image signal obtained by subtracting the image signal generated by the blue pixel 100 in which the 940 infrared light filter 130 is disposed from the image signal generated by the red pixel 100 in which the 940 infrared light filter 130 is disposed. A graph 346 is an image signal generated by the blue pixel 100 in which the 940 infrared light filter 130 is disposed. A graph 347 is a graph showing an image signal obtained by subtracting the image signal generated by the blue pixel 100 in which the 940 infrared light filter 130 is disposed from the image signal generated by the green pixel 100 in which the 750 infrared light filter 130 is disposed. It is possible to respectively detect the infrared light having the wavelengths of 750 nm, 850 nm, and 940 nm by the image signals corresponding to the graphs 345, 346, and 347.

A graph 348 in FIG. 18C is an image signal generated by the green pixel 100 in which the 850 infrared light filter 130 is disposed. Since the graphs 345 and 346 are similar to the graph of b in the same figure, descriptions thereof will be omitted. It is possible to respectively detect the infrared light having the wavelengths of 750 nm, 850 nm, and 940 nm by the image signals corresponding to the graphs 345, 346, and 348.

As described above, even in a case in which the two infrared light filters 130 are disposed, it is possible to generate the infrared light image signal according to the infrared light of the three wavelengths. Note that, when an LED light source that emits the infrared light to the subject is disposed, an LED light source that emits the infrared light having the wavelength according to the infrared light filter 130 is used. For example, when the infrared light filter 130 of FIG. 10 is adopted, an LED light source that emits the infrared light having the wavelengths of 750 nm and 850 nm is disposed. As described above, an LED light source that emits the infrared light of the wavelength to be attenuated in the infrared light filter 130 is disposed.

Method of Manufacturing Infrared Light Filter

FIGS. 19A-F are diagram illustrating an example of the method of manufacturing the infrared light filter according to the second embodiment of the present technology. The same figures are diagrams showing a manufacturing process of the infrared light filter 130 of the case in which the infrared light filter 130 is disposed on the lower layer of the color filter 120. First, a resin 201 that is a material of the infrared light filter 130 (for example, the 750 infrared light filter 130) is applied on the planarization film 141 formed on the surface of the semiconductor substrate 151. A resist 202 is formed thereon. The resist 202 is able to be formed by photolithography (FIG. 19A). Next, the resin 201 is etched. The etching is able to be performed by dry etching. At this time, the resist 202 is used as an etching mask. Next, the resist 202 is removed. Therefore, it is possible to form one infrared light filter 130 of the two infrared light filters 130 (FIG. 19B).

Next, an oxide film 139 as a stopper film in a process of chemical mechanical polishing (CMP) that will be described later is formed (FIG. 19C). Next, a resin 203 that is a material of the infrared light filter 130 (for example, the 850 infrared light filter 130) is applied (FIG. 19D). Next, a resist 204 is formed (FIG. 19E). Next, CMP is performed to grind the resin 203 and the resist 204 on the infrared light filter 130 generated in b of the same figure, and thus the surface is planarized (FIG. 19F). Therefore, it is possible to form the second infrared light filter 130. Thereafter, the color filter 120 and the on-chip lens 111 are sequentially formed, and thus the imaging element 1 is able to be manufactured.

Note that, a process of removing the resin 203 by dry etching and a process of removing the resist 204 are able to be performed in place of the process described in FIG. 19F. At this time, the oxide film 139 is able to be used as a stopper film when dry etching is performed on the resin 203. In addition, it is also possible to omit the oxide film 139 of FIG. 19C.

As described above, since the imaging element 1 includes the two infrared light filters 130, the imaging element 1 according to the second embodiment of the present technology is able to form the infrared light filter 130 by performing the process of applying the material resin of the infrared light filter 130 and etching twice.

Another Method of Manufacturing Infrared Light Filter

FIGS. 20 and 21 are diagrams illustrating another example of the method of manufacturing the infrared light filter according to the second embodiment of the present technology. FIGS. 20A-E and 21A-B are diagrams showing a process of manufacturing the infrared light filter 130 of the case in which the infrared light filter 130 is disposed on the upper layer of the color filter 120. First, an oxide film 138 is formed on the surface of the color filter 120 formed on the semiconductor substrate 151. The oxide film 138 is used as a stopper film (FIG. 20A). Next, a resin 201 is applied and a resist 202 is formed (FIG. 20B). Next, the resin 201 is etched (FIG. 20C). Next, an oxide film 139 is formed (FIG. 20D). Next, a resin 203 is applied (FIG. 20E), and a resist 204 is formed (FIG. 21A). Next, CMP is performed to grind an extra resin 203 and resist 204, and the surface is planarized (FIG. 21B). Thereafter, the on-chip lens 111 is formed, and thus the imaging element 1 is able to be manufactured.

Since the configuration of the imaging element 1 other than this is similar to the configuration of the imaging element 1 described in the first embodiment of the present technology, descriptions thereof will be omitted.

As described above, the imaging element 1 according to the second embodiment of the present technology is able to further simplify the configuration of the imaging element 1 by disposing the two infrared light filters 130 in the pixels 100, respectively, and generating the infrared light image signal.

3. Third Embodiment

In the imaging element 1 according to the second embodiment described above, the infrared light filter 130 that attenuates the infrared light of the same wavelength is disposed in two green pixels 100 configured in the Bayer arrangement. On the other hand, the imaging element 1 according to the third embodiment of the present technology is different from the second embodiment described above in that an infrared light filter 130 that attenuates infrared light of different wavelengths is disposed in two green pixels 100 of the Bayer arrangement.

Configuration of Imaging Element

FIG. 22 is a diagram illustrating a disposition example of the color filter and the infrared light filter according to the third embodiment of the present technology. The infrared light filter 130 in the same figure is different from the infrared light filter 130 described with reference to FIG. 10 in that the infrared light filter 130 that attenuates the infrared light of the different wavelengths is disposed in the two green pixels 100 in the Bayer arrangement. Note that, in the same figure, the color filters 120 disposed in the two green pixels 100 of the Bayer arrangement are described as Gr and Gb and are identified. As shown in the same figure, the 750 infrared light filter 130 is disposed in the red pixel 100 and the green pixel 100 (Gr), and the 940 infrared light filter 130 is disposed in the blue pixel 100 and the green pixel 100 (Gb).

Spectral Characteristics of Case in which Color Filter and Infrared Light Filter are Stacked FIG. 23 is a diagram illustrating an example of the spectral characteristics of the color filter and the infrared light filter according to the third embodiment of the present technology. The same figure is a diagram showing the spectral characteristics of the color filter 120 and the infrared light filter 130 based on the combination described with reference to FIG. 22, and is a diagram describing a graph that shows the spectral characteristics of four pixels 100 based on the Bayer arrangement. The same reference signs as the graph described with reference to FIGS. 6A-6C are applied to the graph of the same figure.

Generation of Image Signal According to Infrared Light

FIG. 24 is a diagram illustrating an example of generation of the image signal according to the infrared light according to the third embodiment of the present technology. The same figure is a diagram showing the infrared light image signal generated by calculating the difference between the image signals generated by the pixels 100, similarly to FIG. 8, and is a diagram showing the image signal of the imaging element 1 to which the combination of the color filter 120 and the infrared light filter 130 described in FIG. 22 is applied.

A graph 349 of the same figure is a graph showing an image signal obtained by subtracting the image signal generated by the blue pixel 100 in which the 940 infrared light filter 130 is disposed from the image signal generated by the green pixel 100 in which the 940 infrared light filter 130 is disposed. Since the graphs 346 and 347 are similar to the graphs described with reference to FIGS. 18A-C, the description thereof will be omitted. It is possible to respectively detect the infrared light having the wavelengths of 750 nm, 850 nm, and 940 nm by the image signals corresponding to the graphs 349, 346, and 347.

Since the configuration of the imaging element 1 other than this is similar to the configuration of the imaging element 1 described in the first embodiment of the present technology, descriptions thereof will be omitted.

As described above, the imaging element 1 according to the third embodiment of the present technology is able to generate the infrared light image signal in the configuration in which the infrared light filter 130 that attenuates the infrared light of the different wavelengths is disposed in the two green pixels 100 of the Bayer arrangement.

4. Fourth Embodiment

In the imaging element 1 according to the first embodiment described above, the color filter 120 and the infrared light filter 130 are stacked and used. On the other hand, the imaging element 1 according to the fourth embodiment of the present technology is different from the first embodiment described above in that filtering of the visible light and the infrared light is performed by one filter.

Configuration of Imaging Element

FIG. 25 is a diagram illustrating a disposition example of the color filter and the infrared light filter according to the fourth embodiment of the present technology. The same figure is different from the imaging element 1 described with reference to FIGS. 3A and 3B in that a filter 180 is provided instead of the color filter 120 and the infrared light filter 130. The filter 180 in the same figure performs a band pass type filtering that transmits visible light of a predetermined wavelength in the visible light region and a band removal type filtering that attenuates infrared light of a predetermined wavelength in the infrared light region. Specifically, a filter 180 (denoted as R+SIR 940 in the same figure) that transmits the red light in the visible light region and attenuates the infrared light of the wavelength of 940 nm in the infrared light region is disposed in the imaging element 1 of the same figure. In addition, a filter 180 (denoted as G+SIR 750 in the same figure) that transmits the green light in the visible light region and attenuates the infrared light of the wavelength of 750 nm in the infrared light region is further disposed in the imaging element 1 in the same figure. In addition, a filter 180 (denoted as B+SIR 850 in the same figure) that transmits the blue light in the visible light region and attenuates the infrared light of the wavelength of 850 nm in the infrared light region is further disposed in the imaging element 1 in the same figure.

The filters 180 are able to be configured, for example, by dispersing a pigment that is a material of the color filter 120 and a pigment that is a material of the infrared light filter 130 in the resin.

Since the configuration of the imaging element 1 other than this is similar to the configuration of the imaging element 1 described in the first embodiment of the present technology, descriptions thereof will be omitted.

As described above, the imaging element 1 according to the fourth embodiment of the present technology is able to configure the imaging element 1 by the filter 180 of a single layer and simplify the configuration of the imaging element 1.

5. Fifth Embodiment

In the imaging element 1 according to the first embodiment described above, the infrared light filter 130 is disposed in the pixel 100. On the other hand, the imaging element 1 according to the fifth embodiment of the present technology is different from the first embodiment described above in that the infrared light filter 130 is also disposed in a region around the region in which the pixel 100 is formed.

Configuration of Pixel

FIG. 26 is a diagram illustrating a configuration example of a pixel according to the fifth embodiment of the present technology. The same figure is a schematic cross-sectional view showing a configuration of the pixel array unit 10 of the imaging element 1. In the same figure, a region 13 denotes an effective pixel region in which the pixel 100 is disposed, and a region 14 denotes a region around the effective pixel region. The imaging element 1 of the same figure is different from the imaging element 1 described with reference to FIG. 2 in that the infrared light filter 130 is disposed in the region 14 in addition to the region 13. As shown in the same figure, the color filter 120 is disposed in the region 13. It is possible to dispose the infrared light filter 130 in a wider range than the color filter 120 formation region by disposing the infrared light filter 130 in the regions 13 and 14. Therefore, it is possible to further planarize the color filter 120 and reduce unevenness in the thickness of the color filter 120. Note that it is also possible to dispose the planarization film 141 in the region 14 in place of the infrared light filter 130. The region 13 is an example of a pixel region described in the claims.

Since the configuration of the imaging element 1 other than this is similar to the configuration of the imaging element 1 described in the first embodiment of the present technology, descriptions thereof will be omitted.

As described above, the imaging element 1 according to the fifth embodiment of the present technology is able to cause the thickness of the color filter 120 to be uniform and improve image quality by disposing the infrared light filter 130 in the region around the region in which the pixel 100 is formed.

6. Sixth Embodiment

In the imaging element 1 according to the first embodiment described above, the infrared light filter 130 is disposed adjacently to an adjacent pixel 100. On the other hand, the imaging element 1 according to the sixth embodiment of the present technology is different from the first embodiment described above in that a light shielding portion is disposed between the infrared light filters 130 of the adjacent pixels 100.

Configuration of Pixel

FIG. 27 is a diagram illustrating a configuration example of the pixel according to the sixth embodiment of the present technology. The pixel array unit 10 of the imaging element 1 of the same figure is different from the imaging element 1 described with reference to FIG. 2 in that the light shielding portion 143 is provided between the infrared light filters 130 between the adjacent pixels 100. Incidentally, the light shielding portion 143 of the same figure is also disposed between adjacent planarization films 141 and between the color filters 120, and is disposed adjacently to the light shielding film 142. The light shielding portion 143 includes a metal such as tungsten and is a film shielding light obliquely incident from the adjacent pixel 100. It is possible to prevent the light transmitted through the color filter 120 or the like of the pixel 100 from obliquely entering the adjacent pixel 100 and reaching the photoelectric conversion unit 154 of the pixel 100 by disposing the light shielding portion 143. Therefore, it is possible to prevent color mixing. Note that a configuration of the light shielding portion 143 is not limited to this example. For example, it is possible to configure the light shielding portion 143 so that the light shielding portion 143 has substantially the same height as the infrared light filter 130. In addition, the infrared light filter 130 is also able to be disposed on the lower layer of the color filter 120.

Another Method of Manufacturing Infrared Light Filter

FIGS. 28A-F are diagrams illustrating an example of the method of manufacturing the infrared light filter according to the sixth embodiment of the present technology. The same figures are diagrams showing the manufacturing process of the infrared light filter 130 in the case in which the infrared light filter 130 is disposed on the lower layer of the color filter 120. First, the light shielding portion 143 is formed on the planarization film 141. The light shielding portion 143 is able to be formed, for example, by forming a groove by dry etching in a region of the planarization film 141 that forms the light shielding portion 143, forming a tungsten film by chemical vapor deposition (CVD) or the like, and performing dry etching (FIG. 28A). Next, a resin 201 is applied, and a resist 202 is formed (FIG. 28B). Next, etching of the resin 201 and removal of the resist 202 are performed (FIG. 28C). Next, a resin 203 is applied (FIG. 28D), and a resist 204 is formed (FIG. 28E). Next, the extra resin 203 and resist 204 are removed and planarized by CMP or the like (FIG. 28F). Therefore, it is possible to form the infrared light filter 130 in which the light shielding portion 143 is disposed.

Since the configuration of the imaging element 1 other than this is similar to the configuration of the imaging element 1 described in the first embodiment of the present technology, descriptions thereof will be omitted.

As described above, the imaging element 1 according to the sixth embodiment of the present technology is able to prevent occurrence of the color mixing by disposing the light shielding portion 143 between the infrared light filters 130 of the adjacent pixels 100. Therefore, it is possible to improve image quality.

Seventh Embodiment

In the imaging element 1 according to the first embodiment described above, the infrared light filter 130 is disposed in all the pixels 100. On the other hand, the imaging element 1 according to the seventh embodiment of the present technology is different from the first embodiment described above in that the infrared light filter 130 of a part of the pixels 100 is omitted.

Configuration of Pixel

FIG. 29 is a diagram illustrating a configuration example of the pixel according to the seventh embodiment of the present technology. The pixel array unit 10 of the imaging element 1 of the same figure is different from the imaging element 1 described with reference to FIG. 2 in that it includes a pixel 400 in which the planarization film 141 is disposed instead of an infrared light filter 130, in addition to including a pixel 100 in which an infrared light filter 130 is disposed. Since the infrared light filter 130 is not disposed in the pixel 400 of the same figure, an image signal based on the visible light and the infrared light is generated similarly to a normal imaging element. Therefore, when performing normal imaging, the image signal generated by the pixel 400 is used. On the other hand, when performing imaging in a low illumination environment such as nighttime, the image signal generated by the pixel 100 is used, for example, the calculation described with reference to FIG. 8 is performed. Therefore, in a low illumination environment, it is possible to generate the image signal according to the infrared light from the subject as image signals corresponding to the red light, the green light, and the blue light. Such switching between the normal imaging and the infrared light imaging is able to be determined and performed, for example, according to a signal level of the image signal from the pixel 400 by the column signal processing unit 30 described with reference to FIG. 1. In addition, it is also possible to control switching by a processing circuit outside the imaging element 1.

Note that the configuration of the imaging element 1 is not limited to this example. For example, similarly to FIG. 3B, the color filter 120 and the infrared light filter 130 may be exchanged.

Disposition of Pixel

FIGS. 30A-30D are diagrams illustrating disposition examples of the pixels according to the seventh embodiment of the present technology. The same figures are diagrams showing the disposition of the pixel 100 and the pixel 400 in the pixel array unit 10. In the pixel array unit 10 of the same figure, the color filters 120 of the pixel 100 and the pixel 400 are disposed in a Bayer arrangement. A solid rectangle of the same figure denotes the color filter 120, and "R" and the like of the same figure denote a type of the color filter 120. In addition, a dotted rectangle of the same figure denotes the infrared light filter 130, and "SIR 750" and the like denote a type of the infrared light filter 130.

FIG. 30A shows the pixel array unit 10 configured by replacing one of the pixels 400 corresponding to one of the two green pixels disposed in each of four Bayer arrangements of pixels with the pixel 100. In particular, in this example the green pixels are replaced with the green pixel 100 in which the 750 infrared light filter 130 is disposed, the red pixel 100 in which the 940 infrared light filter 130 is disposed, and the blue pixel in which the 850 infrared light filter 130 is disposed.

FIG. 30B shows an example in which the pixels 100 configured in the Bayer arrangement and the pixels 400 configured in the Bayer arrangement are alternately disposed. The image signal generated by the pixels 100 and 400 is able to be distributed, for example, in the column signal processing unit 30, and a process such as calculation is able to be performed on the image signal.

FIG. 30C shows four sub-arrays of 2×2 pixels having the same color filter and the same infrared light filter are combined to form a 16 pixel Bayer arrangement. In this example, a first sub-array is formed from pixels that each include a green color filter and a 750 nm infrared light filter; a second sub-array is formed from pixels that each include a red color filter and a 940 nm infrared light filter; a third sub-array is formed from pixels that each include a blue color filter and a 850 nm infrared light filter; and a fourth sub-array is formed from pixels that each include a green color filter and a 750 nm infrared light filter.

FIG. 30D shows four sub-arrays of 2×2 pixels having the same color filter and at least one pixel that includes an infrared light filter are combined to form a 16 pixel Bayer arrangement. In this example, a first sub-array is formed from pixels that each include a green color filter, with at least one of the pixels also including an infrared light filter, such as a 750 nm infrared light filter; a second sub-array is formed from pixels that each include a red color filter, with at least one of the pixels also including an infrared light filter, such as a 940 nm filter; a third sub-array is formed from pixels that each include a blue color filter, with at least one of the pixels also including an infrared light filter, such as a 850 nm infrared light filter; and a fourth sub-array is formed from pixels that each include a green color filter, with at least one of the pixels also including an infrared light filter, such as a 750 nm infrared light filter.

Since the configuration of the imaging element 1 other than this is similar to the configuration of the imaging element 1 described in the first embodiment of the present technology, descriptions thereof will be omitted.

As described above, in the imaging element 1 according to at least some variants of the seventh embodiment of the present technology, the pixel 100 and the pixel 400 in which the infrared light filter 130 is omitted are mixed and disposed in the pixel array unit 10. Therefore, using such embodiments it is possible to generate the normal image signal and the image signal according to the infrared light by one imaging element 1.

8. Eighth Embodiment

The imaging element 1 of an embodiment of the present technology is able to be applied to various products. A mounting form of the imaging element 1 in a case in which the imaging element 1 is applied to a mobile apparatus is proposed.

Configuration of Imaging Apparatus

FIGS. 31A-B are diagram illustrating a configuration example of an imaging element according to the eighth embodiment of the present technology. The same figures are diagrams showing a configuration of an imaging element package mounted on the mobile apparatus. FIG. 31A is a plan view of an imaging element package 2, and FIG. 31B is a cross-sectional view of the imaging element package 2. The imaging element package 2 in the same figure includes imaging elements 1a and 1b, a frame 3, a protective glass 4, an infrared light shielding filter 5, and an ultraviolet light shielding filter 6.

The imaging elements 1a and 1b are semiconductor chips that perform imaging the visible light and the infrared light, respectively. The frame 3 is a frame on which the imaging elements 1a and 1b are mounted. The protective glass 4 is a glass that protects the imaging elements 1a and 1b. The infrared light shielding filter 5 is a filter that shields the infrared light. In addition, the infrared light shielding filter 5 is further able to shield ultraviolet light. It is possible to prevent the infrared light and the ultraviolet light from entering the imaging element 1a by the infrared light shielding filter 5. Therefore, it is possible to reduce an error due to the infrared light and the ultraviolet light when imaging of the visible light is performed. The ultraviolet light shielding filter 6 is a filter that shields the ultraviolet light. It is possible to prevent the ultraviolet light from entering the imaging element 1b by the ultraviolet light shielding filter 6. Therefore, it is possible to reduce an error due to the ultraviolet light when imaging of the infrared light is performed.

FIGS. 32A-C are diagrams illustrating another example of the configuration of the imaging element according to the eighth embodiment of the present technology. FIG. 32A is a plan view of the imaging element package 2, and FIG. 32B is a cross-sectional view of the imaging element package 2. In addition, FIG. 32C is a plan view illustrating the configuration of the imaging element 1 disposed in the imaging element package 2. The imaging element package 2 in the same figure is different from the imaging element package 2 described with reference to FIGS. 31A-B in that one imaging element 1 is used. In the imaging element package 2 of the same figure, the infrared light shielding filter 5 and the ultraviolet light shielding filter 6 are disposed adjacently to an upper surface of the protective glass 4.

The imaging element 1 of the same figure performs imaging the visible light in a region on a left side of the pixel array unit 10. Visible light from which the infrared light and the ultraviolet light have been removed enters the corresponding region by the infrared light shielding filter 5. In addition, the imaging element 1 of the same figure performs imaging the infrared light in a region on a right side of the pixel array unit 10. Visible light and infrared light from which the ultraviolet light has been removed enter the corresponding region by the ultraviolet light shielding filter 6. Light transmitted through the infrared light shielding filter 5 and light transmitted through the ultraviolet light shielding filter 6 enter a central region 15 of the imaging element 1. The region corresponds to an invalid region, and the image signal generated in the region 15 is excluded from generation of the image.

As described above, it is possible to shield the imaging element 1 from an outside air by sealing the imaging element 1 with the frame 3 and the protective glass 4 and disposing the infrared light shielding filter 5 and the ultraviolet light shielding filter 6.

As described above, the imaging element 1 according to the eighth embodiment of the present technology is able to configure the imaging element package that is able to be mounted on a mobile apparatus and improve reliability of the imaging element 1.

<9. Application Example to Camera System>

The present technology is able to be applied to various products. For example, the present technology may be realized as an imaging element mounted on an imaging apparatus such as a camera.

FIG. 33 is a block diagram illustrating a schematic configuration example of a camera that is an example of the imaging apparatus to which the present technology is able to be applied. The camera 1000 of the same figure includes a lens 1001, an imaging element 1002, an imaging control unit 1003, an image processing unit 1005, an operation input unit 1006, a frame memory 1007, a display unit 1008, and a recording unit 1009. In addition, the camera 1000 of the same figure further includes an infrared light shielding filter 1010, an infrared light shielding filter control unit 1011, an LED light source 1013, and an LED light source driving unit 1012.

The lens 1001 is a photographing lens of the camera 1000. The lens 1001 condenses light from a subject and causes the light to enter the imaging element 1002 that will be described later to form an image of the subject.

The imaging element 1002 is a semiconductor element that images the light from the subject condensed by the lens 1001. The imaging element 1002 generates an analog image signal according to emitted light, converts the analog image signal into a digital image signal, and outputs the digital image signal.

The operation input unit 1006 receives an operation input from a user of the camera 1000. For example, a push button or a touch panel is able to be used as the operation input unit 1006. The operation input received by the operation input unit 1006 is transferred to the imaging control unit 1003 or the image processing unit 1005. Thereafter, a process according to the operation input, for example, a process such as imaging of the subject is started.

The frame memory 1007 is a memory that stores a frame that is an image signal for one screen. The frame memory 1007 is controlled by the image processing unit 1005, and holds a frame in a process of image processing.

The display unit 1008 displays the image processed by the image processing unit 1005. For example, a liquid crystal panel is able to be used for the display unit 1008.

The recording unit 1009 records the image processed by the image processing unit 1005. For example, a memory card or a hard disk is able to be used for the recording unit 1009.

The imaging control unit 1003 controls imaging in the imaging element 1002. The imaging control unit 1003 controls the imaging element 1002 by generating a control signal and outputting the control signal to the imaging element 1002. Note that, for example, the imaging control unit 1003 is able to include a digital signal processor (DSP) on which firmware is mounted.

The image processing unit 1005 processes the image signal generated by the imaging element 1002. The process includes, for example, a demosaic for generating an image signal of insufficient color among image signals corresponding to red, green and blue for each pixel, noise reduction for removing noise of an image signal, encoding of an image signal, and the like. In addition, the image processing unit 1005 further performs a process of calculating the difference of the image signals. Note that the image processing unit 1005 is able to include, for example, a microcomputer on which firmware is mounted.

The infrared light shielding filter 1010 is a filter inserted into an optical path between the imaging element 1002 and the subject when imaging of the visible light is performed to prevent the infrared light from entering the imaging element 1002.

The infrared light shielding filter control unit 1011 drives the infrared light shielding filter 1010. The infrared light shielding filter control unit 1011 includes a motor and the like, and controls insertion and removal of the infrared light shielding filter 1010 into and from the optical path between the imaging element 1002 and the subject.

The LED light source 1013 is a light source that emits the infrared light to the subject. The LED light source 1013 irradiates the subject with the infrared light in a low illumination environment such as nighttime.

The LED light source driving unit 1012 drives the LED light source 1013. The LED light source driving unit 1012 controls the irradiation of the infrared light in the LED light source 1013.

The camera to which the present technology is able to be applied has been described above. The present technology is able to be applied to the imaging element 1002 in the configuration described above. Specifically, the imaging element 1 described with reference to FIG. 1 is able to be applied to the imaging element 1002. In addition, the imaging control unit 1003 is able to further control the LED light source driving unit 1012 and the infrared light shielding filter control unit 1011. When imaging of the visible light is performed, the imaging control unit 1003 controls the infrared light shielding filter control unit 1011 to insert the infrared light shielding filter 1010 into the optical path described above, and controls the imaging element 1002 to perform imaging.

At this time, the image processing unit 1005 generates the image signal of the visible light on the basis of the image signal generated by the red pixel 100, the green pixel 100, and the blue pixel 100. That is, the image processing unit 1005 generates a red image signal that is an image signal according to the red light on the basis of the image signal generated by the red pixel 100. Similarly, the image processing unit 1005 generates a green image signal and a blue image signal, that are image signals according to the green light and the blue light, respectively, on the basis of the image signals generated by the green pixel 100 and the blue pixel 100.

On the other hand, when imaging of the infrared light is performed, the control unit 1003 controls the infrared light shielding filter control unit 1011 to remove the infrared light shielding filter 1010 from the optical path described above, and controls the LED light source driving unit to cause the LED light source 1013 to emit the infrared light. At this time, the image processing unit 1005 calculates the difference between the image signals generated by the imaging element 1002 and generates the infrared light image signal. Therefore, it is possible to perform imaging and generation of the image signal by the infrared light.

Note that the LED light source driving unit 1012 is an example of a light source described in the claims. The imaging control unit 1003 and the image processing unit 1005 are examples of a processing circuit described in the claims. The camera 1000 is an example of an imaging apparatus described in the claims.

Note that, here, the camera has been described as an example, but the technology according to the present technology may be applied to other apparatuses, for example, a surveillance apparatus and the like.

<10. Example of Application to Mobile Object>

The technology according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is able to be applied has been described above. The technology according to the present disclosure is able to be applied to the imaging section 12031 among the configurations described above. Specifically, the imaging element 1 described with reference to FIG. 1 is able to be applied to the imaging section 12031. Imaging with the infrared light is able to be performed by applying the technology according to the present disclosure to the imaging section 12031. Since it is possible to obtain a clear image of the subject in a low illumination environment such as nighttime, it is possible to reduce fatigue of the driver.

Finally, the description of each of the embodiments described above is an example of the present technology, and the present technology is not limited to the embodiments described above. Therefore, of course, various modifications are able to be made according to the design or the like as long as the modifications do not depart from the technical spirit according to the present technology, even if the modifications are other than each of the embodiments described above.

Additionally, the present technology may also be configured as below.

(1) An imaging device, comprising:
a substrate;
a plurality of photoelectric conversion units formed in the substrate;
a plurality of color filters, wherein each photoelectric conversion unit in the plurality of photoelectric conversion units is associated with at least one corresponding color filter in the plurality of color filters; and
a plurality of infrared light filters, wherein at least some of the photoelectric conversion units in the plurality of photoelectric conversion units are associated with at least one corresponding infrared light filter in the plurality of infrared light filters.

(2) The imaging device of (1), wherein each of the photoelectric conversion units in the plurality of photoelectric conversion units is associated with one infrared light filter in the plurality of infrared light filters.

(3) The imaging device of (1) or (2), wherein the plurality of color filters includes at least one color filter that passes visible light of a first wavelength, at least one color filter that passes visible light of a second wavelength, and at least one filter that passes visible light of a third wavelength.

(4) The imaging device of any of (1) to (3), wherein the plurality of infrared light filters includes at least one infrared light filter that blocks infrared light of a first wavelength, and at least one infrared light filter that blocks infrared light of a second wavelength.

(5) The imaging device of any of (1) to (3), wherein the plurality of infrared light filters includes at least one infrared light filter that blocks infrared light of a first wavelength, at least one infrared light filter that blocks infrared light of a second wavelength, and at least one infrared light filter that blocks infrared light of a third wavelength.

(6) The imaging device of any of (1) to (3), wherein each color filter that passes visible light of the first wavelength is paired with an infrared light filter that blocks infrared light of the first wavelength, and wherein each color filter that passes visible light of the second wavelength is paired with an infrared light filter that blocks infrared light of the second wavelength.

(7) The imaging device of (6), wherein each color filter that passes visible light of the third wavelength is paired with an infrared light filter that blocks infrared light of the third wavelength.

(8) The imaging device of (6), wherein each color filter that passes visible light of the third wavelength is paired with an infrared light filter that blocks infrared light of the second wavelength.

(9) The imaging device of any of (1), and (3) to (8), wherein less than all of the color filters are paired with an infrared light filter.

(10) The imaging device of any of (1) to (9), wherein the color filters of the plurality of color filters are disposed in a first layer, and wherein the infrared filters of the plurality of color filters are disposed in a second layer.

(11) The imaging device of (10), wherein the first layer is between the second layer and the light incident surface of the semiconductor substrate.

(12) The imaging device of (10), wherein the second layer is between the first layer and the light incident surface of the semiconductor substrate.

(13) The imaging device of any of (1) to (12), wherein the plurality of color filters includes at least one color filter that passes red light, at least one color filter that passes green light, and at least one filter that passes blue light, wherein the at least one color filter that passes red light is paired with an infrared light filter that blocks light having a wavelength of 850 nm, wherein the at least one color filter that passes green light is paired with an infrared light filter that blocks infrared light having a wavelength of 750 nm, and wherein the at least one color filter that passes blue light is paired with an infrared light filter that blocks light having a wavelength of 850 nm.

(14) The imaging device of (1), wherein the plurality of color filters includes at least one color filter that passes red light, at least one color filter that passes green light, and at least one filter that passes blue light, wherein the at least one color filter that passes red light is paired with an infrared light filter that blocks light having a wavelength of 940 nm, wherein the at least one color filter that passes green light is paired with an infrared light filter that blocks infrared light having a wavelength of 750 nm, and wherein the at least one color filter that passes blue light is paired with an infrared light filter that blocks light having a wavelength of 850 nm.

(15) The imaging device of (14) wherein the plurality of color filters and the plurality of infrared light filters are integrated in a single filter layer.

(16) The imaging device of (14), wherein at least some of the color filters are not paired with any infrared light filter.

(17) The imaging device of (1), wherein the plurality of color filters includes at least one color filter that passes red light, at least two color filters that pass green light, and at least one filter that passes blue light, wherein the at least one color filter that passes red light is paired with an infrared light filter that blocks light having a wavelength of 750 nm, wherein a first one of the at least two color filters that passes green light is paired with an infrared light filter that blocks infrared light having a wavelength of 750 nm, wherein a second one of the at least two color filters that passes green light is paired with an infrared light filter that blocks infrared light having a wavelength of 940 nm, and wherein the at least one color filter that passes blue light is paired with an infrared light filter that blocks light having a wavelength of 940 nm.

(18) The imaging device of any of (1) to (17), further comprising:
a pixel separation portion between adjacent photoelectric conversion units;
a light shielding portion over each of the pixel separation portions; and
a plurality of on-chip lenses, wherein the color filters and the infrared light filters are between the on-chip lenses and a light incident surface of the substrate.

(19) The imaging device of (18), wherein the plurality of infrared light filters are included in a layer that includes a portion disposed in a region around a region outside of a pixel region.

(20) The imaging device of (18), wherein the light shielding portion extends between adjacent color filters and adjacent infrared light filters.

In at some additional aspects, the disclosed technology includes;
(21) An electronic apparatus, comprising:
an imaging device, including:
a substrate;
a plurality of photoelectric conversion units formed in the substrate;
a plurality of color filters, wherein each photoelectric conversion unit in the plurality of photoelectric conversion units is associated with at least one corresponding color filter in the plurality of color filters; and
a plurality of infrared light filters, wherein at least some of the photoelectric conversion units in the plurality of photoelectric conversion units are associated with at least one corresponding infrared light filter in the plurality of infrared light filters;
a lens, wherein the lens passes light from a subject to the imaging device; and
an infrared light source, wherein the infrared light source is selectively operable to illuminate the subject with infrared light.

In still other aspects, the disclosed technology includes:
(22) An imaging element including:
a first pixel that includes a first color filter that transmits infrared light and transmits first visible light among visible light and a first infrared light filter that transmits the visible light and attenuates first infrared light among the infrared light, and generates an image signal according to light transmitted through the first color filter and the first infrared light filter;
a second pixel that includes a second color filter that transmits the infrared light and transmits second visible light among the visible light and a second infrared light filter that transmits the visible light and attenuates second infrared light among the infrared light, and generates an image signal according to light transmitted through the second color filter and the second infrared light filter; and
a third pixel that includes a third color filter that transmits the infrared light and transmits third visible light among the visible light and a third infrared light filter that transmits the visible light and attenuates third infrared light among the infrared light, and generates an image signal according to light transmitted through the third color filter and the third infrared light filter.

(23) The imaging element according to (22), wherein the first pixel further includes an on-chip lens that condenses light from a subject and causes the light from the subject to be transmitted through the first color filter and the first infrared light filter, the second pixel further includes an on-chip lens that condenses the light from the subject and causes the light from the subject to be transmitted through the second color filter and the second infrared light filter, and the third pixel further includes an on-chip lens that condenses the light from the subject and causes the light from the subject to be transmitted through the third color filter and the third infrared light filter.

In still other aspects, the disclosed technology includes:
(24) An imaging element including:
a first pixel that includes a first color filter that transmits infrared light and transmits first visible light among visible light and a first infrared light filter that transmits the visible light and attenuates first infrared light among the infrared light, and generates an image signal according to light transmitted through the first color filter and the first infrared light filter;

a second pixel that includes a second color filter that transmits the infrared light and transmits second visible light among the visible light and a second infrared light filter that transmits the visible light and attenuates second infrared light among the infrared light, and generates an image signal according to light transmitted through the second color filter and the second infrared light filter; and a third pixel that includes a third color filter that transmits the infrared light and transmits third visible light among the visible light and any of the first infrared light filter and the second infrared light filter, and generates an image signal according to light transmitted through the third color filter and any of the first infrared light filter and the second infrared light filter.

(25) The imaging element of (24), wherein the first infrared light and the second infrared light may have wavelengths different from each other by at least 30 nm.

(26) The imaging element of (24) or (25), wherein the first infrared light and the second infrared light have wavelengths of any of approximately 750 nm, 850 nm, and 940 nm.

(27) The imaging element of any of (24) to (26), wherein the first pixel, the second pixel, and the third pixel generate an image signal according to light having at least any one of wavelengths of approximately 750 nm, 850 nm, and 940 nm.

(28) The imaging element of any of (24) to (27), wherein the first visible light, the second visible light, and the third visible light may be any of red light, green light, and blue light.

(29) The imaging element of any of (24) to (28), wherein the first pixel, the second pixel, and the third pixel are configured in a Bayer arrangement.

(30) The imaging element of (29), wherein the third visible light in the third pixel is the green light, and two third pixels configured in the Bayer arrangement include the first infrared light filter and the second infrared light filter different from each other.

(31) The imaging element of any of (24) to (30), wherein a pixel region in which the first pixel, the second pixel, and the third pixel are disposed in a two-dimensional grid pattern; and a planarization film adjacent to at least one of the first infrared light filter or the second infrared light filter and disposed around the pixel region are further included.

(32) The imaging element of (31), wherein the planarization film includes at least one of the first infrared light filter or the second infrared light filter.

(33) The imaging element of any of (24) to (32), further including a light shielding portion that shields light between the first infrared light filter and the second infrared light filter in the adjacent second pixel and third pixel.

(34) The imaging element of any of (24) to (31), wherein the first pixel further includes an on-chip lens that condenses light from a subject and causes the light from the subject to be transmitted through the first color filter and the first infrared light filter, the second pixel further includes an on-chip lens that condenses the light from the subject and causes the light from the subject to be transmitted through the second color filter and the second infrared light filter, and the third pixel further includes an on-chip lens that condenses the light from the subject and causes the light from the subject to be transmitted through the third color filter and any of the first infrared light filter and the second infrared light filter.

In accordance with still further aspects, the disclosed technology includes:

(35) An imaging element including:

a first pixel that includes a first filter that performs band pass type filtering of transmitting first visible light in a visible light region and performs band removal type filtering of attenuating first infrared light in an infrared light region, and generates an image signal according to light transmitted through the first filter;

a second pixel that includes a second filter that performs band pass type filtering of transmitting second visible light in the visible light region and performs band removal type filtering of attenuating second infrared light in the infrared light region, and generates an image signal according to light transmitted through the second filter; and a third pixel that includes a third filter that performs band pass type filtering of transmitting third visible light in the visible light region and performs band removal type filtering of attenuating any of the first infrared light and the second infrared light in the infrared light region, and generates an image signal according to light transmitted through the third filter.

(36) The imaging element according to (35), wherein the first pixel further includes an on-chip lens that condenses light from a subject and causes the light from the subject to be transmitted through the first filter, the second pixel further includes an on-chip lens that condenses the light from the subject and causes the light from the subject to be transmitted through the second filter, and the third pixel further includes an on-chip lens that condenses the light from the subject and causes the light from the subject to be transmitted through the third filter.

In accordance with still other aspects, the disclosed technology includes:

(37) An imaging apparatus including:

a first pixel that includes a first color filter that transmits infrared light and transmits first visible light among visible light and a first infrared light filter that transmits the visible light and attenuates first infrared light among the infrared light, and generates a first image signal that is an image signal according to light transmitted through the first color filter and the first infrared light filter;

a second pixel that includes a second color filter that transmits the infrared light and transmits second visible light among the visible light and a second infrared light filter that transmits the visible light and attenuates second infrared light among the infrared light, and generates a second image signal that is an image signal according to light transmitted through the second color filter and the second infrared light filter;

a third pixel that includes a third color filter that transmits the infrared light and transmits third visible light among the visible light and any of the first infrared light filter and the second infrared light filter, and generates a third image signal that is an image signal according to light transmitted through the third color filter and any of the first infrared light filter and the second infrared light filter; and a processing circuit that generates a first infrared light signal that is an image signal according to the first infrared light, a second infrared light signal that is an image signal according to the second infrared light, and a third infrared light signal that is an image signal according to infrared light different from the first infrared light and the second infrared light, on the basis of the generated first image signal, the generated second image signal, and the generated third image signal.

(38) The imaging apparatus of (37), wherein the processing circuit generates the first infrared light signal, the second infrared light signal, and the third infrared light signal on the basis of a mutual difference between the generated first image signal, the generated second image signal, and the generated third image signal.

(39) The imaging apparatus of (37) of (38), further including a light source that irradiates a subject with the infrared light.

(40) The imaging apparatus of (39), wherein the light source emits the infrared light including the first infrared light and the second infrared light.

(41) The imaging apparatus of any of (37) to (40), further including an infrared light shielding filter that shields the infrared light; and an infrared light shielding filter control unit that controls incidence of the infrared light on the first pixel, the second pixel, and the third pixel by inserting the infrared light shielding filter in an optical path between a subject and the first pixel, the second pixel, and the third pixel.

(42) The imaging apparatus of any of (37) to (41), wherein the first pixel further includes an on-chip lens that condenses light from a subject and causes the light from the subject to be transmitted through the first color filter and the first infrared light filter, the second pixel further includes an on-chip lens that condenses the light from the subject and causes the light from the subject to be transmitted through the second color filter and the second infrared light filter, and the third pixel further includes an on-chip lens that condenses the light from the subject and causes the light from the subject to be transmitted through the third color filter and any of the first infrared light filter and the second infrared light filter.

In accordance with still further embodiments, the disclosed technology includes:

(45) An imaging element including:

an on-chip lens unit;

a light reception unit; a first filter layer disposed between the on-chip lens unit and the light reception unit; and a second filter layer disposed between the on-chip lens unit and the light reception unit, wherein the on-chip lens unit includes a first on-chip lens, a second on-chip lens, and a third on-chip lens, the first filter layer includes a first color filter that transmits infrared light and transmits first visible light among visible light, a second color filter that transmits the infrared light and transmits second visible light among the visible light, and a third color filter that transmits the infrared light and transmits third visible light among the visible light, the second filter layer includes a first infrared light filter that transmits the visible light and attenuates first infrared light among the infrared light, a second infrared light filter that transmits the visible light and attenuates second infrared light among the infrared light, and a third infrared light filter that transmits the visible light and attenuates third infrared light among the infrared light, the light reception unit includes a first photoelectric conversion unit, a second photoelectric conversion unit, and a third photoelectric conversion unit, the first color filter and the first infrared light filter are disposed between the first on-chip lens and the first photoelectric conversion unit, the second color filter and the second infrared light filter are disposed between the second on-chip lens and the second photoelectric conversion unit, and the third color filter and the third infrared light filter are disposed between the third on-chip lens and the third photoelectric conversion unit.

In accordance with still further aspects, the disclosed technology includes:

(44) An imaging element including:

an on-chip lens unit;

a light reception unit;

a first filter layer disposed between the on-chip lens unit and the light reception unit; and a second filter layer disposed between the on-chip lens unit and the light reception unit, wherein the on-chip lens unit includes a first on-chip lens, a second on-chip lens, and a third on-chip lens, the first filter layer includes a first color filter that transmits infrared light and transmits first visible light among visible light, a second color filter that transmits the infrared light and transmits second visible light among the visible light, and a third color filter that transmits the infrared light and transmits third visible light among the visible light, the second filter layer includes a first infrared light filter that transmits the visible light and attenuates first infrared light among the infrared light, a second infrared light filter that transmits the visible light and attenuates second infrared light among the infrared light, and a third infrared light filter that transmits the visible light and attenuates third infrared light among the infrared light, the light reception unit includes a first photoelectric conversion unit, a second photoelectric conversion unit, and a third photoelectric conversion unit, the first photoelectric conversion unit performs photoelectric conversion of light transmitted through the first on-chip lens, the first color filter, and the first infrared light filter, the second photoelectric conversion unit performs photoelectric conversion of light transmitted through the second on-chip lens, the second color filter, and the second infrared light filter, and the third photoelectric conversion unit performs photoelectric conversion of light transmitted through the third on-chip lens, the third color filter, and the third infrared light filter.

REFERENCE SIGNS LIST 1, 1a, 1b imaging element
2 imaging element package
3 frame
4 protective glass
5 infrared light shielding filter
6 ultraviolet light shielding filter
10 pixel array unit
13 to 15 region
20 vertical driving unit
30 column signal processing unit
40 control unit
100 pixel
110 on-chip lens unit
111 on-chip lens
120 color filter
130 infrared light filter
138, 139 oxide film
141 planarization film
142 light shielding film
143 light shielding portion
151 semiconductor substrate
154 photoelectric conversion unit
155 insulating film
180 filter
1002 imaging element
1005 image processing unit 1010 infrared light shielding filter
1011 infrared light shielding filter control unit
1013 LED light source
12031, 12101 to 12105 imaging section

What is claimed is:

1. An imaging device, comprising:
a substrate;
a plurality of photoelectric conversion units formed in the substrate;
a plurality of color filters, wherein each photoelectric conversion unit in the plurality of photoelectric conversion units is associated with at least one corresponding color filter in the plurality of color filters; and
a plurality of infrared light filters, wherein at least some of the photoelectric conversion units in the plurality of photoelectric conversion units are associated with at least one corresponding infrared light filter in the plurality of infrared light filters, wherein the plurality of color filters includes at least one color filter that passes red light, at least one color filter that passes green light, and at least one color filter that passes blue light, wherein the at least one color filter that passes red light is paired with an infrared light filter that blocks light having a wavelength of 850 nm, wherein the at least one color filter that passes green light is paired with an infrared light filter that blocks infrared light having a wavelength of 750 nm, and wherein the at least one color filter that passes blue light is paired with an infrared light filter that blocks light having a wavelength of 850 nm.

2. The imaging device of claim 1, wherein each of the photoelectric conversion units in the plurality of photoelectric conversion units is associated with one infrared light filter in the plurality of infrared light filters.

3. The imaging device of claim 1, wherein the color filters of the plurality of color filters are disposed in a first layer, and wherein the infrared light filters of the plurality of infrared light filters are disposed in a second layer.

4. The imaging device of claim 3, wherein the first layer is between the second layer and a light incident surface of the substrate.

5. The imaging device of claim 3, wherein the second layer is between the first layer and a light incident surface of the substrate.

6. The imaging device of claim 1, further comprising:
a pixel separation portion between adjacent photoelectric conversion units;
a light shielding portion over each of the pixel separation portions; and
a plurality of on-chip lenses, wherein the color filters and the infrared light filters are between the on-chip lenses and a light incident surface of the substrate.

7. The imaging device of claim 6, wherein the plurality of infrared light filters are included in a layer that includes a portion disposed in a region outside of a pixel region.

8. The imaging device of claim 6, wherein the light shielding portion extends between adjacent color filters and adjacent infrared light filters.

9. The imaging device of claim 1, wherein the plurality of color filters and the plurality of infrared light filters are integrated in a single filter layer.

10. An imaging device, comprising:
a substrate;
a plurality of photoelectric conversion units formed in the substrate;
a plurality of color filters, wherein each photoelectric conversion unit in the plurality of photoelectric conversion units is associated with at least one corresponding color filter in the plurality of color filters; and
a plurality of infrared light filters, wherein at least some of the photoelectric conversion units in the plurality of photoelectric conversion units are associated with at least one corresponding infrared light filter in the plurality of infrared light filters, wherein the plurality of color filters includes at least one color filter that passes red light, at least one color filter that passes green light, and at least one color filter that passes blue light, wherein the at least one color filter that passes red light is paired with an infrared light filter that blocks light having a wavelength of 940 nm, wherein the at least one color filter that passes green light is paired with an infrared light filter that blocks infrared light having a wavelength of 750 nm, and wherein the at least one color filter that passes blue light is paired with an infrared light filter that blocks light having a wavelength of 850 nm.

11. The imaging device of claim 10, wherein the plurality of color filters and the plurality of infrared light filters are integrated in a single filter layer.

12. The imaging device of claim 10, wherein at least some of the color filters are not paired with any infrared light filter.

13. The imaging device of claim 10, wherein each of the photoelectric conversion units in the plurality of photoelectric conversion units is associated with one infrared light filter in the plurality of infrared light filters.

14. The imaging device of claim 10, wherein the color filters of the plurality of color filters are disposed in a first layer, and wherein the infrared light filters of the plurality of infrared light filters are disposed in a second layer.

15. The imaging device of claim 14, wherein the first layer is between the second layer and a light incident surface of the substrate.

16. The imaging device of claim 14, wherein the second layer is between the first layer and a light incident surface of the substrate.

17. An imaging device, comprising:
a substrate;
a plurality of photoelectric conversion units formed in the substrate;
a plurality of color filters, wherein each photoelectric conversion unit in the plurality of photoelectric conversion units is associated with at least one corresponding color filter in the plurality of color filters; and
a plurality of infrared light filters, wherein at least some of the photoelectric conversion units in the plurality of photoelectric conversion units are associated with at least one corresponding infrared light filter in the plurality of infrared light filters, wherein the plurality of color filters includes at least one color filter that passes red light, at least two color filters that pass green light, and at least one color filter that passes blue light, wherein the at least one color filter that passes red light is paired with an infrared light filter that blocks light having a wavelength of 750 nm, wherein a first one of the at least two color filters that passes green light is paired with an infrared light filter that blocks infrared light having a wavelength of 750 nm, wherein a second one of the at least two color filters that passes green light is paired with an infrared light filter that blocks infrared light having a wavelength of 940 nm, and wherein the at least one color filter that passes blue light is paired with an infrared light filter that blocks light having a wavelength of 940 nm.

18. The imaging device of claim 17, wherein less than all of the color filters are paired with an infrared light filter.

19. The imaging device of claim 17, wherein the color filters of the plurality of color filters are disposed in a first layer, and wherein the infrared light filters of the plurality of color filters are disposed in a second layer.

20. The imaging device of claim 19, wherein the first layer is between the second layer and a light incident surface of the substrate.

* * * * *